(12) United States Patent  
Minegishi et al.

(10) Patent No.: US 9,090,119 B2
(45) Date of Patent: Jul. 28, 2015

(54) PATTERN FORMING METHOD

(71) Applicant: JSR CORPORATION, Tokyo (JP)

(72) Inventors: Shin-ya Minegishi, Tokyo (JP); Shin-ya Nakafuji, Tokyo (JP); Takanori Nakano, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 14/210,803

(22) Filed: Mar. 14, 2014

(65) Prior Publication Data

US 2014/0224765 A1 Aug. 14, 2014

Related U.S. Application Data

(63) Continuation of application No. 13/430,691, filed on Mar. 27, 2012, now Pat. No. 8,715,916, which is a continuation of application No. PCT/JP2010/066592, filed on Sep. 24, 2010.

(30) Foreign Application Priority Data

Sep. 29, 2009 (JP) ................................. 2009-225440

(51) Int. Cl.
| | |
|---|---|
| G03F 7/40 | (2006.01) |
| H01L 21/027 | (2006.01) |
| B44C 1/22 | (2006.01) |
| G03F 7/16 | (2006.01) |
| G03F 7/11 | (2006.01) |
| G03F 7/09 | (2006.01) |
| H01L 21/02 | (2006.01) |
| H01L 21/033 | (2006.01) |

(52) U.S. Cl.
CPC ................ *B44C 1/227* (2013.01); *G03F 7/091* (2013.01); *G03F 7/094* (2013.01); *G03F 7/11* (2013.01); *G03F 7/168* (2013.01); *G03F 7/40* (2013.01); *H01L 21/02118* (2013.01); *H01L 21/0332* (2013.01); *H01L 21/0334* (2013.01); *H01L 21/0335* (2013.01); *H01L 21/0337* (2013.01)

(58) Field of Classification Search
None
See application file for complete search history.

(56) References Cited

U.S. PATENT DOCUMENTS

| | | | |
|---|---|---|---|
| 8,715,916 B2 * | 5/2014 | Minegishi et al. ............ 430/323 |
| 2003/0059552 A1 | 3/2003 | Yasunami et al. |
| 2007/0122740 A1 | 5/2007 | Hatakeyama et al. |
| 2008/0206676 A1 | 8/2008 | De et al. |
| 2008/0292987 A1 | 11/2008 | Houlihan et al. |
| 2008/0292995 A1 | 11/2008 | Houlihan et al. |
| 2009/0246691 A1 | 10/2009 | Rahman et al. |
| 2009/0280435 A1 | 11/2009 | McKenzie et al. |
| 2010/0151392 A1 | 6/2010 | Rahman et al. |
| 2010/0316949 A1 | 12/2010 | Rahman et al. |
| 2011/0151376 A1 | 6/2011 | Rahman et al. |

FOREIGN PATENT DOCUMENTS

| | | |
|---|---|---|
| JP | 2000-143937 | 5/2000 |
| JP | 2001-40293 | 2/2001 |
| JP | 2002-311594 | 10/2002 |
| JP | 2006-093693 | 4/2006 |
| JP | 2006-251369 | 9/2006 |
| JP | 2008-310229 | 12/2008 |
| JP | 2009-128369 | 6/2009 |
| TW | 201011078 A1 | 3/2010 |
| TW | 201107885 A1 | 3/2011 |
| WO | WO 2011/040340 | 4/2011 |

OTHER PUBLICATIONS

International Search Report for corresponding International Application No. PCT/JP2010/066592, Oct. 19, 2010.
Written Opinion for corresponding International Application No. PCT/JP2010/066592, Oct. 19, 2010.
Korean Office Action for corresponding KR Application No. 10-2012-7005422, Aug. 8, 2013.
Japanese Office Action for corresponding JP Application No. 2011-534221, Dec. 24, 2013.
Hesse, W. 2000. Phenolic Resins. Ullmann's Encyclopedia of Industrial Chemistry, 16 pages.
Combined Taiwanese Office Action and Search Report issued Aug. 27, 2014 in Patent Application No. 099132830 (with English language translation).
Office Action issued Mar. 31, 2015, in Taiwan Patent Application No. 099132830 filed Sep. 28, 2010 (w/ English translation).

* cited by examiner

*Primary Examiner* — Cynthia Hamilton
(74) *Attorney, Agent, or Firm* — Oblon, McClelland, Maier & Neustadt, L.L.P.

(57) ABSTRACT

A pattern-forming method includes forming a resist underlayer film on a substrate using a resist underlayer film-forming composition. The resist underlayer film-forming composition includes a base component, and a crosslinking agent. A content of hydrogen atom in the resist underlayer film is from 0 to 50 atom %. The crosslinking agent has a partial structure represented by a following general formula (i). X represents an oxygen atom, a sulfur atom, or —NR—. R represents a hydrogen atom, an alkyl group having 1 to 9 carbon atoms, or an aryl group having 6 to 30 carbon atoms. $n_1$ is an integer from 1 to 6. $R^1$ represents a hydrogen atom, an alkyl group having 1 to 9 carbon atoms, or an aryl group having 6 to 30 carbon atoms.

(i)

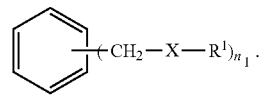

6 Claims, No Drawings

PATTERN FORMING METHOD

CROSS-REFERENCE TO RELATED APPLICATIONS

The present application is a continuation application of the U.S. patent application Ser. No. 13/430,691 filed Mar. 27, 2012, which in turn is a continuation application of International Application No. PCT/JP2010/066592, filed Sep. 24, 2010, which claims priority to Japanese Patent Application No. 2009-225440, filed Sep. 29, 2009. The contents of these applications are incorporated herein by reference in their entirety.

BACKGROUND OF THE INVENTION

1. Field of the Invention

The present invention relates to a pattern-forming method.

2. Discussion of the Background

An integrated circuit device has been produced using a multilayer resist process that implements a reduction in pattern size in order to achieve a higher degree of integration. When using the multilayer resist process, a liquid resist underlayer film-forming composition and a liquid photoresist composition are sequentially applied to a substrate. A mask pattern is transferred to the photoresist film using a reduction projection aligner (stepper), and the photoresist film is developed using an appropriate developer to obtain a photoresist pattern. The photoresist pattern is transferred to the resist underlayer film by dry-etching. The pattern of the resist underlayer film is transferred to the substrate by dry-etching to obtain a substrate having a desired pattern. A multilayer resist process that utilizes one resist underlayer film may be referred to as "two-layer resist process", and a multilayer resist process that utilizes two resist underlayer films may be referred to as "three-layer resist process".

The resist underlayer film normally functions as an antireflective film that absorbs radiation reflected by the substrate. The resist underlayer film that comes in direct contact with the substrate is normally formed using a material having a high carbon content. The etching selectivity when processing the substrate is improved when the material for forming the resist underlayer film has a high carbon content, so that the pattern can be transferred more accurately. A thermosetting phenol novolac resin is well-known as the material for forming the resist underlayer film. It has been known that a resist underlayer film formed using a composition that contains an acenaphthylene polymer exhibits good properties, for example in JP-A 2000-143937 and JP-A 2001-40293.

However, the resist underlayer film may be over-etched when further reducing the size of the etching pattern. Therefore, an improvement in pattern transfer capability and etching resistance has been desired. In particular, it has been desired to prevent a situation in which the pattern of the resist underlayer film is bent when transferring a fine pattern using the resist underlayer film as a photomask.

SUMMARY OF THE INVENTION

According to one aspect of the present invention, a pattern-forming method includes forming a resist underlayer film on a substrate using a resist underlayer film-forming composition. An intermediate layer is formed on the resist underlayer film. A resist composition is applied to the resist underlayer film on which the intermediate layer is formed to form a resist film. The resist film is exposed by selectively applying radiation to the resist film. The exposed resist film is developed to form a resist pattern. The intermediate layer, the resist underlayer film, and the substrate are dry-etched using the resist pattern as a mask to form a given pattern on the substrate. The resist underlayer film-forming composition includes a base component and a crosslinking agent. A content of hydrogen atom in the resist underlayer film is from 0 to 50 atom %.

The crosslinking agent has a partial structure represented by a following general formula (i).

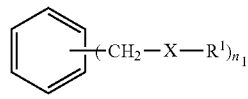

(i)

X represents an oxygen atom, a sulfur atom, or —NR—, wherein R represents a hydrogen atom, an alkyl group having 1 to 9 carbon atoms, or an aryl group having 6 to 30 carbon atoms, and in a case where a plurality of X are present, each of the plurality of X is either identical or different. $n_1$ is an integer from 1 to 6. $R^1$ represents a hydrogen atom, an alkyl group having 1 to 9 carbon atoms, or an aryl group having 6 to 30 carbon atoms, wherein in a case where a plurality of $R^1$ are present, each of the plurality of $R^1$ is either identical or different.

DESCRIPTION OF THE EMBODIMENTS

The embodiments of the present invention are as follows.

[1] A pattern-forming method comprising:
(1) a resist underlayer film-forming process that includes forming a resist underlayer film on a substrate using a resist underlayer film-forming composition;
(1') an intermediate layer-forming process that includes forming an intermediate layer on the resist underlayer film;
(2) a resist film-forming process that includes forming a resist film by applying a resist composition to the resist underlayer film on which the intermediate layer is formed;
(3) an exposure process that includes exposing the resist film by selectively applying radiation to the resist film;
(4) a resist pattern-forming process that includes developing the exposed resist film to form a resist pattern; and
(5) a pattern-forming process that includes dry-etching the intermediate layer, the resist underlayer film, and the substrate using the resist pattern as a mask to form a given pattern on the substrate; characterized in
that the resist underlayer film-forming composition comprises (A) a base component, and (B) a crosslinking agent having a partial structure represented by the following general formula (i),

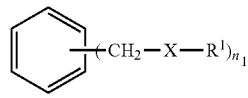

(i)

wherein X represents an oxygen atom, a sulfur atom, or —NR— (wherein R represents a hydrogen atom, an alkyl group having 1 to 9 carbon atoms, or an aryl group having 6 to 30 carbon atoms), provided that a plurality of X may be either identical or different when a plurality of X are present, $n_1$ is an integer from 1 to 6, and $R^1$ represents a hydrogen atom, an alkyl group having 1 to 9 carbon atoms, or an aryl group having 6 to 30 carbon atoms, provided that a plurality of $R^1$ may be either identical or different when a plurality of $R^1$ are present.

[2] The pattern-forming method according to [1] above, wherein the crosslinking agent (B) is at least one of a compound represented by the following general formula (b1-1) and a compound represented by the following general formula (b2),

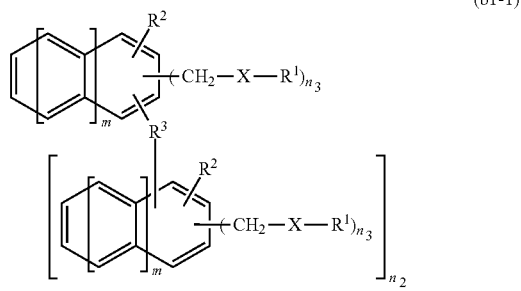

(b1-1)

wherein X represents an oxygen atom, a sulfur atom, or —NR— (wherein R represents a hydrogen atom, an alkyl group having 1 to 9 carbon atoms, or an aryl group having 6 to 30 carbon atoms), provided that a plurality of X may be either identical or different when a plurality of X are present, $n_2$ is an integer from 1 to 5, $n_3$ is independently an integer from 1 to 4, m is independently 0 or 1, $R^1$ represents a hydrogen atom, an alkyl group having 1 to 9 carbon atoms, or an aryl group having 6 to 30 carbon atoms, provided that a plurality of $R^1$ may be either identical or different when a plurality of $R^1$ are present, $R^2$ represents a hydrogen atom, a hydroxyl group, an alkyl group having 1 to 9 carbon atoms, or an aryl group having 6 to 22 carbon atoms, provided that a plurality of $R^2$ may be either identical or different when a plurality of $R^2$ are present, and $R^3$ represents a single bond, an oxygen atom, an ester group, a carbonyl group, a chain-like hydrocarbon group having 1 to 30 carbon atoms, an alicyclic hydrocarbon group having 3 to 30 carbon atoms, an aromatic hydrocarbon group having 6 to 30 carbon atoms, a nitrogen atom, a sulfur atom, or an ($n_2$+1)-valent group formed by arbitrarily combining these groups and atoms,

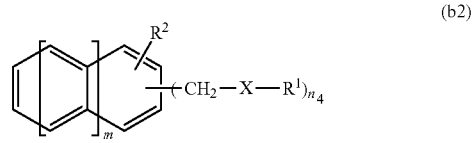

(b2)

wherein X represents an oxygen atom, a sulfur atom, or —NR— (wherein R represents a hydrogen atom, an alkyl group having 1 to 9 carbon atoms, or an aryl group having 6 to 30 carbon atoms), provided that a plurality of X may be either identical or different when a plurality of X are present, $n_4$ is an integer from 1 to 5, m is 0 or 1, $R^1$ represents a hydrogen atom, an alkyl group having 1 to 9 carbon atoms, or an aryl group having 6 to 30 carbon atoms, provided that a plurality of $R^1$ may be either identical or different when a plurality of $R^1$ are present, and $R^2$ represents a hydrogen atom, a hydroxyl group, an alkyl group having 1 to 9 carbon atoms, or an aryl group having 6 to 22 carbon atoms.

[3] The pattern-forming method according to [1] above, wherein the crosslinking agent (B) is a compound represented by the following general formula (b1-2),

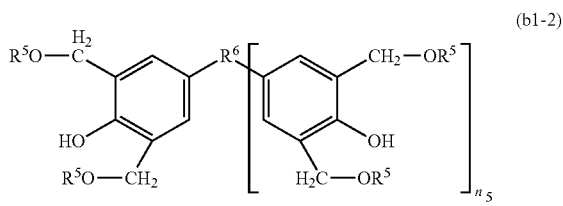

(b1-2)

wherein $n_5$ is an integer from 1 to 5, $R^5$ represents independently a hydrogen atom, an alkyl group having 1 to 9 carbon atoms, or an aryl group having 6 to 30 carbon atoms, and $R^6$ represents a single bond, an oxygen atom, an ester group, a carbonyl group, a chain-like hydrocarbon group having 1 to 30 carbon atoms, an alicyclic hydrocarbon group having 3 to 30 carbon atoms, an aromatic hydrocarbon group having 6 to 30 carbon atoms, a nitrogen atom, a sulfur atom, or an ($n_5$+1)-valent group formed by arbitrarily combining these groups and atoms.

[4] The pattern-forming method according to [1] above, wherein the crosslinking agent (B) is a compound represented by the following general formula (b1-3),

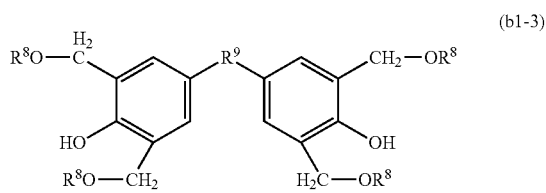

(b1-3)

wherein $R^8$ represents independently a hydrogen atom, an alkyl group having 1 to 9 carbon atoms, or an aryl group having 6 to 30 carbon atoms, and $R^9$ represents a single bond, an oxygen atom, an ester group, a carbonyl group, a chain-like hydrocarbon group having 1 to 30 carbon atoms, an alicyclic hydrocarbon group having 3 to 30 carbon atoms, an aromatic hydrocarbon group having 6 to 30 carbon atoms, a sulfur atom, —NR— (wherein R represents a hydrogen atom, an alkyl group having 1 to 9 carbon atoms, or an aryl group having 6 to 30 carbon atoms), or a divalent group formed by arbitrarily combining these groups and atoms.

[5] The pattern-forming method according to any one of [1] to [4] above, wherein the base component (A) is a novolac resin, a resol resin, a styrene resin, an acenaphthylene resin, or a resin having a fullerene skeleton.

[6] The pattern-forming method according to any one of [1] to [5] above, wherein the resist underlayer film-forming composition further comprises (C) a solvent.

[7] A resist underlayer film-forming composition that is used for a pattern-forming method including:

(1) a resist underlayer film-forming process that includes forming a resist underlayer film on a substrate using the resist underlayer film-forming composition;

(1') an intermediate layer-forming process that includes forming an intermediate layer on the resist underlayer film;

(2) a resist film-forming process that includes forming a resist film by applying a resist composition to the resist underlayer film on which the intermediate layer is formed;

(3) an exposure process that includes exposing the resist film by selectively applying radiation to the resist film;
(4) a resist pattern-forming process that includes developing the exposed resist film to form a resist pattern; and
(5) a pattern-forming process that includes dry-etching the intermediate layer, the resist underlayer film, and the substrate using the resist pattern as a mask to form a given pattern on the substrate; characterized in that
the resist underlayer film-forming composition comprising (A) a base component, and (B) a crosslinking agent that includes a partial structure represented by the following general formula (i),

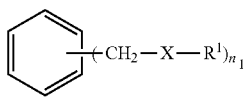

(i)

wherein X represents an oxygen atom, a sulfur atom, or —NR— (wherein R represents a hydrogen atom, an alkyl group having 1 to 9 carbon atoms, or an aryl group having 6 to 30 carbon atoms), provided that a plurality of X may be either identical or different when a plurality of X are present, $n_1$ is an integer from 1 to 6, and $R^1$ represents a hydrogen atom, an alkyl group having 1 to 9 carbon atoms, or an aryl group having 6 to 30 carbon atoms, provided that a plurality of $R^1$ may be either identical or different when a plurality of $R^1$ are present.

According to the pattern-forming method of the embodiment of the present invention in which a specific resist underlayer film-forming composition is used, a resist underlayer film can easily be formed on a substrate, which leads to excellent etching resistance, and suppresses a situation in which the underlayer film pattern is bent when transferring a fine pattern by etching. Moreover, the resist pattern can be transferred to the substrate with excellent reproducibility. Since the underlayer film pattern is not bent when etching the substrate, an increase in yield is expected to be achieved in microfabrication employed in a lithographic process, and particularly the production of integrated circuit devices.

According to the resist underlayer film-forming composition of the embodiment of the present invention, a resist underlayer film can be formed which functions as an antireflective film and exhibits an excellent pattern transfer capability and etching resistance. In addition, a resist underlayer film can easily be formed on a substrate, which suppresses a situation in which the underlayer film pattern is bent when a substrate is subjected to etching. A resist underlayer film formed using the resist underlayer film-forming composition of the embodiment of the present invention exhibits an excellent pattern transfer capability and excellent etching selectivity during a dry etching process (i.e., the resist underlayer film is rarely over-etched, and the resist pattern can be transferred to the substrate with good reproducibility).

Hereinafter the embodiments will be described in detail.
1. Resist Underlayer Film-forming Composition The resist underlayer film-forming composition of the embodiment of the present invention is used for a resist underlayer film-forming process of a pattern-forming method (described later), and includes (A) a base component, and (B) a crosslinking agent having a specific structure.
(A) Base Component In the composition of the embodiment of the present invention, an organic compound is used as the base component for the resist underlayer film. The organic compound may be used singly or in combination of two or more types thereof. The base component (hereinafter may be referred to as "base component (A)") is an organic compound having a film-forming capability.

Specific examples of the base component include (A1) a resin having an aromatic ring, and (A2) a compound having a fullerene skeleton.
(A1) Resin Having Aromatic Ring Examples of the resin having an aromatic ring (hereinafter may be referred to as "resin (A1)") include a novolac resin, a resol resin, a styrene resin, an acenaphthylene resin, a resin having a fullerene skeleton, derivatives thereof, and the like.

Examples of the novolac resin include a resin obtained by reacting one or more phenolic compounds with one or more aldehydes in the presence of an acidic catalyst, the one or more phenolic compounds being selected from phenols such as phenol, cresol, xylenol, resorcinol, bisphenol A, p-tert-butylphenol, and p-octylphenol, and naphthols such as α-naphthol, β-naphthol, 1,5-dihydroxynaphthalene, and 2,7-dihydroxynaphthalene, and the one or more aldehydes being selected from aldehyde sources such as formaldehyde, paraformaldehyde, and trioxane.

Examples of such a resin include a resin represented by the following general formula (a1), a resin represented by the following general formula (a2), and the like.

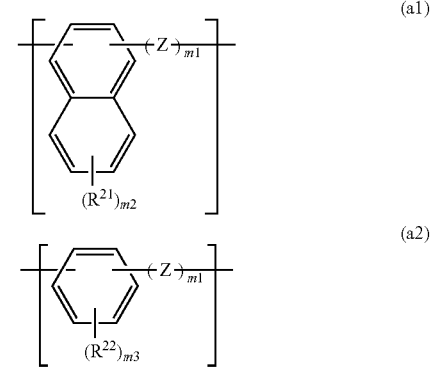

(In the general formulae (a1) and (a2), $R^{21}$ and $R^{22}$ represent independently a hydroxyl group, a substituted or unsubstituted alkyl group having 1 to 6 carbon atoms, a substituted or unsubstituted alkoxyl group having 1 to 6 carbon atoms, a substituted or unsubstituted alkoxycarbonyl group having 2 to 10 carbon atoms, a substituted or unsubstituted aryl group having 6 to 14 carbon atoms, a substituted or unsubstituted glycidyl ether group, or a substituted or unsubstituted alkyl glycidyl ether group (wherein the alkyl moiety has 1 to 6 carbon atoms), m2 is an integer from 0 to 6, provided that a plurality of $R^{21}$ may be either identical or different when m2 is an integer from 2 to 6, m3 is an integer from 0 to 4, provided that a plurality of $R^{22}$ may be either identical or different when m3 is an integer from 2 to 4, Z represents a methylene group, a substituted or unsubstituted alkylene group having 2 to 20 carbon atoms, a substituted or unsubstituted arylene group having 6 to 14 carbon atoms, or a substituted or unsubstituted alkylene ether group, and m1 is an integer from 1 to 8, provided that a plurality of Z may be either identical or different when m1 is an integer from 2 to 8, and m1, m2 and m3 satisfy relationships "1≤m1+m2≤8" and "1≤m1+m3≤8".)

Examples of the unsubstituted alkyl group having 1 to 6 carbon atoms for $R^{21}$ and $R^{22}$ in the general formulae (a1) and (a2) include a methyl group, an ethyl group, a n-propyl group, an i-propyl group, a n-butyl group, a 2-methylpropyl group, a 1-methyl propyl group, a t-butyl group, and the like.

Examples of the unsubstituted alkoxyl group having 1 to 6 carbon atoms for $R^{21}$ and $R^{22}$ include a methoxy group, an ethoxy group, a n-propoxy group, an i-propoxy group, a n-butoxy group, a 2-methylpropoxy group, a 1-methylpropoxy group, a t-butoxy group, a 2-propinyloxy group, and the like.

Examples of the unsubstituted alkoxycarbonyl group having 2 to 10 carbon atoms for $R^{21}$ and $R^{22}$ include a methoxycarbonyl group, an ethoxycarbonyl group, a n-propoxycarbonyl group, an i-propoxycarbonyl group, a n-butoxycarbonyl group, a 2-methylpropoxycarbonyl group, a 1-methylpropoxycarbonyl group, a t-butoxycarbonyl group, and the like.

Examples of the unsubstituted aryl group having 6 to 14 carbon atoms for $R^{21}$ and $R^{22}$ include a phenyl group, a naphthyl group, and the like.

Examples of the unsubstituted alkylglycidyl ether group for $R^{21}$ and $R^{22}$ include a methylglycidyl ether group, an ethylglycidyl ether group, a propylglycidyl ether group, a butylglycidyl ether group, and the like.

Examples of the unsubstituted alkylene group having 2 to 20 carbon atoms for Z in the general formulae (a1) and (a2) include an ethylene group; a propylene group such as a 1,3-propylene group and a 1,2-propylene group; a tetramethylene group; a pentamethylene group; a hexamethylene group; a 1-methyl-1,3-propylene group, a 2-methyl-1,3-propylene group, a 2-methyl-1,2-propylene group, a 1-methyl-1,4-butylene group, a 2-methyl-1,4-butylene group, and the like.

Examples of the unsubstituted arylene group having 6 to 14 carbon atoms for Z include a phenylene group, a naphthylene group, an anthrylene group, a phenanthrylene group, and the like.

The number of carbon atom at the alkylene moiety in the alkylene ether group for Z is preferably in the range from 2 to 20. Specific examples of the alkylene ether group include an ethylene ether group; a propylene ether group such as 1,3-propylene ether group and 1,2-propylene ether group; a tetramethylene ether group; a pentamethylene ether group; a hexamethylene ether group; and the like.

$R^{21}$, $R^{22}$ and Z in the general formulae (a1) and (a2) may have a substituent. Examples of the substituent include a halogen atom, a hydroxyl group, an alkyl group having 1 to 9 carbon atoms, an aryl group having 6 to 22 carbon atoms, and the like.

Examples of the halogen atom include a fluorine atom, a chlorine atom, bromine atom, an iodine atom, and the like.

Examples of the alkyl group having 1 to 9 carbon atoms include a methyl group, an ethyl group, a n-propyl group, an i-propyl group, a n-butyl group, a 2-methylpropyl group, a 1-methyl propyl group, a t-butyl group, and the like.

Examples of the unsubstituted aryl group having 6 to 22 carbon atoms include a phenyl group, a naphthyl group, and the like.

Specific examples of the resol resin include a resin obtained by reacting the above exemplified phenolic compound with the above exemplified aldehyde in the presence of an alkaline catalyst.

Examples of the acenaphthylene resin include a resin having a repeating unit represented by the following general formula (a3), a resin having a repeating unit represented by the following general formula (a4), and the like.

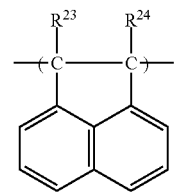

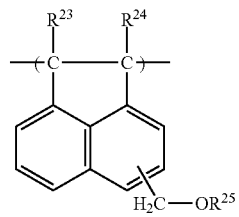

(In the general formulae (a3) and (a4), $R^{23}$ and $R^{24}$ represent independently a hydrogen atom, a halogen atom, a substituted or unsubstituted alkyl group having 1 to 6 carbon atoms, a substituted or unsubstituted alkoxyl group having 1 to 6 carbon atoms, a substituted or unsubstituted alkoxycarbonyl group having 2 to 10 carbon atoms, or a substituted or unsubstituted aryl group having 6 to 14 carbon atoms, and $R^{25}$ represents a hydrogen atom, a substituted or unsubstituted alkyl group having 1 to 6 carbon atoms, a substituted or unsubstituted alkoxy group having 1 to 6 carbon atoms, a substituted or unsubstituted alkoxycarbonyl group having 2 to 10 carbon atoms, or a substituted or unsubstituted aryl group having 6 to 14 carbon atoms.)

Examples of the unsubstituted alkyl group having 1 to 6 carbon atoms for $R^{23}$ to $R^{25}$ in the general formulae (a3) and (a4) include a methyl group, an ethyl group, a n-propyl group, an i-propyl group, a n-butyl group, a 2-methylpropyl group, a 1-methyl propyl group, a t-butyl group, and the like.

Examples of the unsubstituted alkoxyl group having 1 to 6 carbon atoms for $R^{23}$ to $R^{25}$ include a methoxy group, an ethoxy group, a n-propoxy group, an i-propoxy group, a n-butoxy group, a 2-methylpropoxy group, a 1-methylpropoxy group, a t-butoxy group, a 2-propinyloxy group, and the like.

Examples of the unsubstituted alkoxycarbonyl group having 2 to 10 carbon atoms for $R^{23}$ to $R^{25}$ include a methoxycarbonyl group, an ethoxycarbonyl group, a n-propoxycarbonyl group, an i-propoxycarbonyl group, a n-butoxycarbonyl group, a 2-methylpropoxycarbonyl group, a 1-methylpropoxycarbonyl group, a t-butoxycarbonyl group, and the like.

Examples of the unsubstituted aryl group having 6 to 14 carbon atoms for $R^{23}$ to $R^{25}$ include a phenyl group, a naphthyl group, and the like.

Examples of the halogen atom for $R^{23}$ to $R^{24}$ in the general formulae (a3) to (a4) include a fluorine atom, a chlorine atom, bromine atom, an iodine atom, and the like.

$R^{23}$ to $R^{25}$ in the general formulae (a3) and (a4) may have a substituent. Examples of the substituent include a halogen atom, a hydroxyl group, an alkyl group having 1 to 9 carbon atoms, an aryl group having 6 to 22 carbon atoms, and the like.

Examples of the halogen atom include a fluorine atom, a chlorine atom, bromine atom, an iodine atom, and the like.

Examples of the alkyl group having 1 to 9 carbon atoms include a methyl group, an ethyl group, a n-propyl group, an i-propyl group, a n-butyl group, a 2-methylpropyl group, a 1-methyl propyl group, a t-butyl group, and the like.

Examples of the unsubstituted aryl group having 6 to 22 carbon atoms include a phenyl group, a naphthyl group, and the like.

Such resins may be obtained by reacting paraformaldehyde with a polymer of a compound having an acenaphthylene skeleton under acidic conditions.

Examples of the styrene resin or derivatives thereof include a resin having a structure represented by the following general formula (a5).

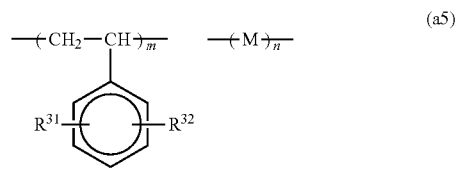

(In the general formula (a5), M represents a radically polymerizable monomer, m is a positive integer, n is 0 or a positive integer, provided that m and n satisfy the relationships "5≤m+n≤200" and "m/(m+n)≥0.5", and $R^{31}$ and $R^{32}$ represent independently a hydrogen atom, an alkyl group, a hydroxyl group, an oxygen atom, an aryl group, or an ester group.)

The radically polymerizable monomer in the general formula (a5) is not particularly limited and various compounds having a polymerizable unsaturated bond may be used. Specific examples include a styrene-based monomer such as styrene and α-methyl styrene; an acrylic monomer such as acrylonitrile, methacrylonitrile, (meth)acrylic acid, (meth)acrylic acid ester including methyl(meth)acrylate, and acrylamide; a vinylether such as ethyl vinylether; maleic anhydride, vinyl acetate, vinyl pyridine, and the like. In the specification, "(meth)acryl" means "acryl" or "methacryl".

Examples of the alkyl group for $R^{31}$ and $R^{32}$ in the general formula (a5) include an alkyl group having 1 to 10 carbon atoms. Specific example thereof includes a methyl group, an ethyl group, a n-propyl group, an i-propyl group, a n-butyl group, a 2-methylpropyl group, a 1-methyl propyl group, a t-butyl group, and the like.

Examples of the aryl group for $R^{31}$ and $R^{32}$ include an aryl group having 6 to 30 carbon atoms. Specific example thereof includes a phenyl group, naphthyl group, and the like.

$R^{31}$ and $R^{32}$ are situated at the para position, the ortho position, or the meta position.

The content of the structural unit derived from M (radically polymerizable monomer) which is a copolymerizable component in the general formula (a5) is preferably less than 50% by mol based on 100% by mol of the total of structural units for the polymer.

A commercially available product may be used as the styrene resin or derivatives thereof (particularly a polyvinylphenol polymer). Examples of the commercially available product include "Maruka Lyncur M" (which is a poly-p-vinylphenol), "Lyncur MB" (which is a brominated poly-p-vinylphenol), "Lyncur CMM" (which is a p-vinylphenol/methyl methacrylate copolymer), "Lyncur CHM" (which is a p-vinylphenol/2-hydroxyethyl methacrylate copolymer), "Lyncur CST" (which is a p-vinylphenol/styrene copolymer) that are manufactured by Maruzen Petrochemical Co., Ltd.; and the like.

The polystyrene-reduced weight average molecular weight (hereinafter may be referred to as "Mw") determined by gel permeation chromatography (GPC) of the resin (A1) is preferably in the range from 500 to 100,000, more preferably from 1,000 to 50,000, and further preferably from 1,200 to 40,000.

Additionally, the ratio (Mw/Mn) of the Mw to the polystyrene-reduced number average molecular weight (hereinafter may be referred to as "Mn") of the resin (A) determined by GPC of the resin (A1) is normally in the range from 1 to 5, and more preferably from 1 to 3.

The resist underlayer film-forming composition of the embodiment of the present invention may contain only one resin (A1) or two or more types thereof (A2) Compound Having Fullerene Skeleton The resist underlayer film-forming composition of the embodiment of the present invention may contain a compound having a fullerene skeleton (hereinafter may be referred to as "compound (A2)") as the base component. Examples of the compound (A2) include fullerenes and fullerene derivatives.

Examples of the fullerenes include a $C_{36}$ fullerene, a $C_{60}$ fullerene, a $C_{70}$ fullerene, a $C_{76}$ fullerene, a $C_{78}$ fullerene, a $C_{82}$ fullerene, a $C_{84}$ fullerene, a $C_{90}$ fullerene, a $C_{96}$ fullerene, higher fullerenes having more than 96 carbon atoms and having a maximum aggregate diameter of 30 nm or less, and the like. Among these, a $C_{60}$ fullerene, a $C_{70}$ fullerene, a $C_{76}$ fullerene, a $C_{82}$ fullerene, and the like are preferably used.

These fullerenes can be synthesized by a known method. The $C_{36}$ fullerene can be synthesized by the method disclosed in "New Diamond" (Vol. 16, No. 2, 2000, pp. 30-31). The $C_{60}$ fullerene, the $C_{70}$ fullerene, the $C_{76}$ fullerene, the $C_{78}$ fullerene, the $C_{82}$ fullerene, the $C_{84}$ fullerene, the $C_{90}$ fullerene, and the $C_{96}$ fullerene can be synthesized by the arc discharge method disclosed in "J. Phy. Chem." (94, 1990, p. 8634), or the oven laser method disclosed in "Z. Phys. D" (40, 1997, p. 414). A higher fullerene having more than 96 carbon atoms and having a maximum aggregate diameter of 30 nm or less can be obtained as a byproduct when synthesizing a fullerene using an arc discharge method. Examples of commercially available products of the $C_{60}$ fullerene and the $C_{70}$ fullerene include products manufactured by Frontier Carbon Corporation, Materials Technologies Research (MTR) Limited, and the like. Examples of commercially available products of the $C_{76}$ fullerene, the $C_{78}$ fullerene, and the $C_{84}$ fullerene include products manufactured by Materials Technologies Research (MTR) Limited, and the like. A mixture of fullerenes that differ in the number of carbon atoms can be used. For example, a mixture of $C_{60}/C_{70}$ fullerenes manufactured by Frontier Carbon Corporation or Materials Technologies Research (MTR) Limited may be used.

Examples of the fullerene derivatives include a functional group-containing fullerene derivative and a heteroring-containing fullerene derivative. The functional group-containing fullerene derivative includes, on the surface of a fullerene, a functional group such as an alkyl group having 1 to 6 carbon atoms, an alkenyl group having 2 to 6 carbon atoms, an alkynyl group having 2 to 6 carbon atoms, a carboxyl group, a hydroxyl group, an epoxy group, and an amino group. The amino group is represented by $-NR^1_2$ (wherein $R^1$ represents a hydrogen atom, an alkyl group having 1 to 6 carbon atoms, an alkenyl group having 2 to 6 carbon atoms, an alkynyl group having 2 to 6 carbon atoms, or a polyether chain having a molecular weight of 30 to 50,000). When $R^1$ is a polyether chain having a molecular weight of 30 to 50,000, the end of the polyether chain may be a hydroxyl group or an alkoxy group having 1 to 6 carbon atoms.

The fullerene derivative may be synthesized by the epoxidation reaction disclosed in "Science" 548 (1991) and "J. Am. Chem. Soc." 1103 (1992), the primary or secondary amine addition reaction disclosed in "Angew. Chem. Int. Ed. Engl." 1309 (1991), the Diels-Alder reaction disclosed in "J. Am. Chem. Soc." 7301 (1992), the polyhydroxylation reaction disclosed in "J. Chem. Soc., Chem. Commun." 1791 (1992), or the like.

On the other hand, the heteroring-containing fullerene derivative is a fullerene derivative in which a group having a heteroring is bonded to a fullerene. The group having a heteroring is preferably a group having a furan ring and/or a thiophene ring. The heteroring-containing fullerene derivative can be obtained by Diels-Alder reaction of a fullerene and a compound having a heteroring such as furan ring. Specifically, a fullerene and a compound having a heteroring (e.g., furfuryl alcohol, furoyl chloride, carboxylfuran, or furfurylamine) can be subjected to Diels-Alder reaction while stirring the fullerene and the compound in a solvent which dissolves the both compounds. It is preferable to subject the fullerene and the compound having a heteroring to Diels-Alder reaction at a temperature ranging 30° C. to 100° C. so that the molar ratio of the fullerene to the heteroring is less than 1.

Specific examples of the fullerene derivatives include the fullerene derivatives disclosed in paragraphs [0044] to [0046] of Japanese Patent Application Publication (KOKAI) No. 2004-264710, the fullerene derivatives disclosed in Japanese Patent Application Publication (KOKAI) No. 2008-164806, the fullerene derivatives disclosed in WO08/062888, the fullerene derivatives disclosed in Japanese Patent Application Publication (KOKAI) No. 2008-129423, and the fullerene derivatives disclosed in Japanese Patent Application Publication (KOKAI) No. 2006-227391.

The resist underlayer film-forming composition of the embodiment of the present invention may contain only one resin (A2) or two or more types thereof (B) Crosslinking Agent The crosslinking agent (hereinafter may be referred to as "crosslinking agent (B)") has a partial structure represented by the following general formula (i). Specifically, the structural formula of a compound used as the crosslinking agent (B) includes at least the structure represented by the general formula (i). The crosslinking agent (B) may be a compound having the structure represented by the general formula (i).

In the resist underlayer film-forming composition of the embodiment of the present invention, when the crosslinking agent (B) reacts with the base component (A), a methylene moiety positioned between the aromatic rings is obtained. Since the hydrogen atom of the methylene moiety is easily oxidized, a new crosslinking point is formed. The new crosslinking point is further crosslinked, so that the hydrogen atom content in the entire material decreases. It is considered that the bending resistance of the resulting resist underlayer film is thus improved.

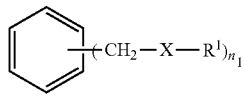
(i)

(In the general formula (i), X represents an oxygen atom, a sulfur atom, or —NR— (wherein R represents a hydrogen atom, an alkyl group having 1 to 9 carbon atoms, or an aryl group having 6 to 30 carbon atoms), provided that a plurality of X may be either identical or different when a plurality of X are present, $n_1$ is an integer from 1 to 6, and $R^1$ represents a hydrogen atom, an alkyl group having 1 to 9 carbon atoms, or an aryl group having 6 to 30 carbon atoms, provided that a plurality of $R^1$ may be either identical or different when a plurality of $R^1$ are present.)

Examples of the alkyl group having 1 to 9 carbon atoms for R in —NR— of X in the general formula (i) include a methyl group, an ethyl group, a n-propyl group, an i-propyl group, a n-butyl group, a 2-methylpropyl group, a 1-methyl propyl group, a t-butyl group, and the like.

Additionally, examples of the aryl group having 6 to 30 carbon atoms for R include a phenyl group, a naphthyl group, a methylphenyl group, an ethylphenyl group, and the like.

Examples of the alkyl group having 1 to 9 carbon atoms for $R^1$ in the general formula (i) include a methyl group, an ethyl group, a n-propyl group, an i-propyl group, a n-butyl group, a 2-methylpropyl group, a 1-methyl propyl group, a t-butyl group, and the like.

Additionally, examples of the aryl group having 6 to 30 carbon atoms for $R^1$ include a phenyl group, a naphthyl group, a methylphenyl group, an ethylphenyl group, and the like.

Moreover, $n_1$ in the general formula (i) is preferably an integer from 1 to 6, and is more preferably an integer from 1 to 3.

Examples of the crosslinking agent (B) having the above structure include a compound represented by the following general formula (b1-1), a compound represented by the following general formula (b2), and the like.

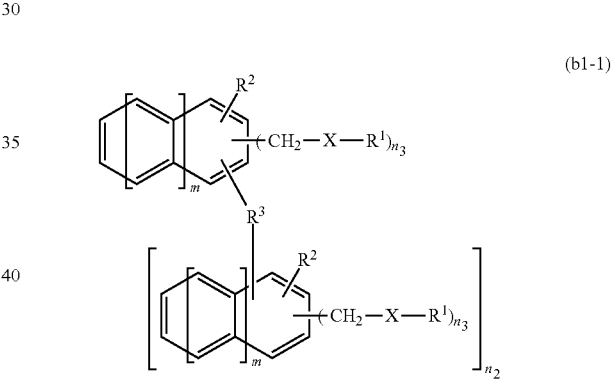
(b1-1)

(In the general formula (b1-1), X represents an oxygen atom, a sulfur atom, or —NR— (wherein R represents a hydrogen atom, an alkyl group having 1 to 9 carbon atoms, or an aryl group having 6 to 30 carbon atoms), provided that a plurality of X may be either identical or different when a plurality of X are present, $n_2$ is an integer from 1 to 5, $n_3$ is independently an integer from 1 to 4, m is independently 0 or 1, $R^1$ represents a hydrogen atom, an alkyl group having 1 to 9 carbon atoms, or an aryl group having 6 to 30 carbon atoms, provided that a plurality of $R^1$ may be either identical or different when a plurality of $R^1$ are present, $R^2$ represents a hydrogen atom, a hydroxyl group, an alkyl group having 1 to 9 carbon atoms, or an aryl group having 6 to 22 carbon atoms, provided that a plurality of $R^2$ may be either identical or different when a plurality of $R^2$ are present, and $R^3$ represents a single bond, an oxygen atom, an ester group, a carbonyl group, a chain-like hydrocarbon group having 1 to 30 carbon atoms, an alicyclic hydrocarbon group having 3 to 30 carbon atoms, an aromatic hydrocarbon group having 6 to 30 carbon atoms, a nitrogen atom, a sulfur atom, or an ($n_2$+1)-valent group formed by arbitrarily combining any one of these groups and atoms.)

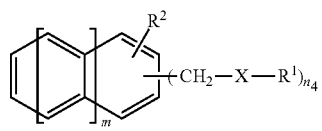
(b2)

(In the general formula (b2), X represents an oxygen atom, a sulfur atom, or —NR— (wherein R represents a hydrogen atom, an alkyl group having 1 to 9 carbon atoms, or an aryl group having 6 to 30 carbon atoms), provided that a plurality of X may be either identical or different when a plurality of X are present, $n_4$ is an integer from 1 to 5, m is 0 or 1, $R^1$ represents a hydrogen atom, an alkyl group having 1 to 9 carbon atoms, or an aryl group having 6 to 30 carbon atoms, provided that a plurality of $R^1$ may be either identical or different when a plurality of $R^1$ are present, and $R^2$ represents a hydrogen atom, a hydroxyl group, an alkyl group having 1 to 9 carbon atoms, or an aryl group having 6 to 22 carbon atoms.)

In the general formula (b1-1), $R^1$ and X are respectively the same as defined for $R^1$ and X in the general formula (i).

Examples of the alkyl group having 1 to 9 carbon atoms for $R^2$ in the general formula (b1-1) include a methyl group, an ethyl group, a n-propyl group, an i-propyl group, a n-butyl group, a 2-methylpropyl group, a 1-methyl propyl group, a t-butyl group, and the like.

Additionally, examples of the aryl group having 6 to 22 carbon atoms for $R^2$ include a phenyl group, a naphthyl group, a methylphenyl group, an ethylphenyl group, and the like.

In the general formula (b1-1), $n_2$ is preferably an integer from 1 to 5, and is more preferably an integer from 1 to 2.

Moreover, $n_3$ is preferably an integer from 1 to 4, and is more preferably an integer from 1 to 3.

Examples of the chain-like hydrocarbon group having 1 to 30 carbon atoms for $R^3$ in the general formula (b1-1) include a $(n_2+1)$-valent group ($n_2$: 1 to 5) derived from a methyl group, an ethyl group, a n-propyl group, an i-propyl group, a n-butyl group, a 2-methylpropyl group, a 1-methylpropyl group, a t-butyl group, a vinyl group, an ethynyl group, and the like.

Examples of the alicyclic hydrocarbon group having 3 to 30 carbon atoms for $R^3$ in the general formula (b1-1) include a $(n_2+1)$-valent group derived from a cyclopropyl group, a cyclobutyl group, a cyclopentyl group, a cyclohexyl group, a methylcyclohexyl group, and the like.

Examples of the aromatic hydrocarbon group having 6 to 30 carbon atoms for $R^3$ in the general formula (b1-1) include a $(n_2+1)$-valent group derived from a phenyl group, a naphthyl group, an anthracenyl group, a pyrene group, a coronene group, and the like.

$R^3$ in the general formula (b1-1) may have a substituent. Examples of the substituent include a halogen atom, a hydroxyl group, an alkyl group having 1 to 9 carbon atoms, an aryl group having 6 to 22 carbon atoms, and the like.

Examples of the alkyl group having 1 to 9 carbon atoms include a methyl group, an ethyl group, a n-propyl group, an i-propyl group, a n-butyl group, a 2-methylpropyl group, a 1-methyl propyl group, a t-butyl group, and the like.

Examples of the aryl group having 6 to 22 carbon atoms include a phenyl group, a naphthyl group, a methylphenyl group, an ethylphenyl group, Examples of the $(n_2+1)$-valent group by arbitrarily combining an oxygen atom, an ester group, a carbonyl group, a chain-like hydrocarbon group having 1 to 30 carbon atoms, an alicyclic hydrocarbon group having 3 to 30 carbon atoms, an aromatic hydrocarbon group having 6 to 30 carbon atoms, a nitrogen atom, or a sulfur atom for $R^3$ in the general formula (b1-1) include a $(n_2+1)$-valent organic group derived from any of the structures represented by the following general formulae (R-1) to (R-4).

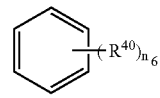
(R-1)

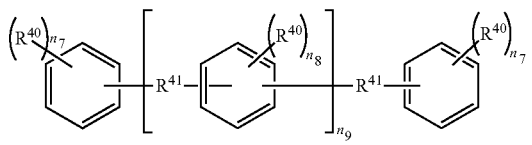
(R-2)

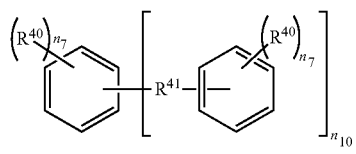
(R-3)

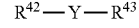
(R-4)

(In the general formulae (R-1) to (R-4), $R^{40}$, $R^{42}$, and $R^{43}$ represent independently a substituted or unsubstituted monovalent hydrocarbon group having 1 to 10 carbon atoms, provided that a plurality of $R^{40}$ may be either identical or different when a plurality of $R^{40}$ are present, a plurality of $R^{42}$ may be either identical or different when a plurality of $R^{42}$ are present, and a plurality of $R^{43}$ may be either identical or different when a plurality of $R^{43}$ are present, $R^{41}$ represents independently a single bond or a substituted or unsubstituted divalent hydrocarbon group having 1 to 10 carbon atoms, provided that a plurality of $R^{41}$ may be either identical or different when a plurality of $R^{41}$ are present, n6 is an integer from 1 to 6, n7 is an integer from 0 to 5, n8 is an integer from 1 to 4, n9 is an integer from 0 to 5, n10 is an integer from 1 to 6, and Y represents an oxygen atom, an ester group, or a carbonyl group.)

Examples of the unsubstituted monovalent hydrocarbon group having 1 to 10 carbon atoms for $R^{40}$, $R^{42}$, and $R^{43}$ in the general formulae (R-1) to (R-4) include a methyl group, an ethyl group, a n-propyl group, an i-propyl group, a n-butyl group, a 2-methylpropyl group, a 1-methyl propyl group, a t-butyl group, and the like.

Examples of the unsubstituted divalent hydrocarbon group having 1 to 10 carbon atoms for $R^{41}$ in the general formulae (R-2) to (R-3) include a methylene group, an ethylene group, a 1,2-propylene group, a 1,3-propylene group, a tetramethylene group, a pentamethylene group, a hexamethylene group, a heptamethylene group, an octamethylene group, and the like.

$R^{40}$ to $R^{43}$ in the general formulae (R-1) to (R-4) may have a substituent. Examples of the substituent include a halogen atom, a hydroxyl group, an alkyl group having 1 to 9 carbon atoms, an aryl group having 6 to 22 carbon atoms, and the like.

Examples of the halogen atom include a fluorine atom, a chlorine atom, bromine atom, an iodine atom, and the like.

Examples of the alkyl group having 1 to 9 carbon atoms include a methyl group, an ethyl group, a n-propyl group, an i-propyl group, a n-butyl group, a 2-methylpropyl group, a 1-methyl propyl group, a t-butyl group, and the like.

Examples of the unsubstituted aryl group having 6 to 22 carbon atoms include a phenyl group, a naphthyl group, and the like.

In the general formula (b2), $R^1$, $R^2$ and X are respectively the same as defined for $R^1$, $R^2$ and X in the general formula (b1-1).

Moreover, $n_4$ in the general formula (b2) is an integer from 1 to 5, and is more preferably an integer from 1 to 3.

Additionally, the crosslinking agent (B) is preferably a compound represented by the following general formula (b1-2).

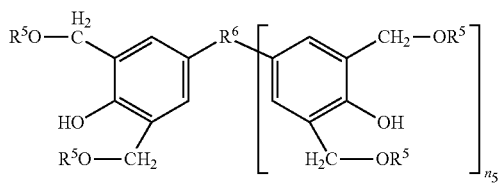

(b1-2)

(In the general formula (b1-2), $n_5$ is an integer from 1 to 5, $R^5$ represents independently a hydrogen atom, an alkyl group having 1 to 9 carbon atoms, or an aryl group having 6 to 30 carbon atoms, and $R^6$ represents a single bond, an oxygen atom, an ester group, a carbonyl group, a chain-like hydrocarbon group having 1 to 30 carbon atoms, an alicyclic hydrocarbon group having 3 to 30 carbon atoms, an aromatic hydrocarbon group having 6 to 30 carbon atoms, a nitrogen atom, a sulfur atom, or an $(n_5+1)$-valent group formed by arbitrarily combining any one of these groups and atoms.)

Examples of the alkyl group having 1 to 9 carbon atoms for $R^5$ in the general formula (b1-2) include a methyl group, an ethyl group, a n-propyl group, an i-propyl group, a n-butyl group, a 2-methylpropyl group, a 1-methyl propyl group, a t-butyl group, and the like.

Additionally, examples of the aryl group having 6 to 30 carbon atoms for $R^5$ include a phenyl group, a naphthyl group, a methylphenyl group, an ethylphenyl group, and the like.

Examples of the chain-like hydrocarbon group having 1 to 30 carbon atoms for $R^6$ in the general formula (b1-2) include a $(n_5+1)$-valent group ($n_5$: 1 to 5) derived from a methyl group, an ethyl group, a n-propyl group, an i-propyl group, a n-butyl group, a 2-methylpropyl group, a 1-methylpropyl group, a t-butyl group, a vinyl group, an ethynyl group, and the like.

Examples of the alicyclic hydrocarbon group having 3 to 30 carbon atoms for $R^6$ in the general formula (b1-2) include a $(n_2+1)$-valent group derived from a cyclopropyl group, a cyclobutyl group, a cyclopentyl group, a cyclohexyl group, a methylcyclohexyl group, and the like.

Examples of the aromatic hydrocarbon group having 6 to 30 carbon atoms for $R^6$ in the general formula (b1-2) include a $(n_5+1)$-valent group derived from a phenyl group, a naphthyl group, an anthracenyl group, a pyrene group, a coronene group, and the like.

In the general formula (b1-2), $n_5$ is an integer of 1 to 5, and is preferably an integer of 1 to 2.

Examples of the $(n_4+1)$-valent group by arbitrarily combining an oxygen atom, an ester group, a carbonyl group, a chain-like hydrocarbon group having 1 to 30 carbon atoms, an alicyclic hydrocarbon group having 3 to 30 carbon atoms, an aromatic hydrocarbon group having 6 to 30 carbon atoms, a nitrogen atom, or a sulfur atom for $R^6$ in the general formula (b1-2) include a $(n_4+1)$-valent organic group derived from any of the structures represented by the above-described general formulae (R-1) to (R-4).

A compound represented by the following general formula (b1-3) is particularly preferred as the crosslinking agent (B).

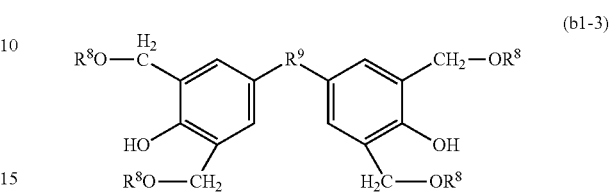

(b1-3)

(In the general formula (b1-3), $R^8$ represents independently a hydrogen atom, an alkyl group having 1 to 9 carbon atoms, or an aryl group having 6 to 30 carbon atoms, and $R^9$ represents a single bond, an oxygen atom, an ester group, a carbonyl group, a chain-like hydrocarbon group having 1 to 30 carbon atoms, an alicyclic hydrocarbon group having 3 to 30 carbon atoms, an aromatic hydrocarbon group having 6 to 30 carbon atoms, a sulfur atom, —NR— (wherein R represents a hydrogen atom, an alkyl group having 1 to 9 carbon atoms, or an aryl group having 6 to 30 carbon atoms), or a divalent group formed by arbitrarily combining these groups and atoms.)

Examples of the alkyl group having 1 to 9 carbon atoms for $R^8$ in the general formula (b1-3) include a methyl group, an ethyl group, a n-propyl group, an i-propyl group, a n-butyl group, a 2-methylpropyl group, a 1-methyl propyl group, a t-butyl group, and the like.

Additionally, examples of the aryl group having 6 to 30 carbon atoms for $R^8$ include a phenyl group, a naphthyl group, a methylphenyl group, an ethylphenyl group, and the like.

Examples of the divalent chained hydrocarbon group having 1 to 30 carbon atoms for $R^9$ in the general formula (b1-3) include a linear alkylene group such as a methylene group, an ethylene group, a 1,2-propylene group, a 1,3-propylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, and an icosylene group; and a branched alkylene group such as a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; and the like.

Examples of the divalent alicyclic hydrocarbon group having 3 to 30 carbon atoms for $R^9$ in the general formula (b1-3) include a monocyclic cycloalkylene group such as a 1,3-cyclobutylene group, a 1,3-cyclopentylene group, a 1,4-cyclohexylene group, and a 1,5-cyclooctylene group; a polycyclic cycloalkylene group such as a 1,4-norbornylene group, a 2,5-norbornylene group, a 1,5-adamantylene group, and 2,6-adamantylene group; and the like.

Examples of the divalent aromatic hydrocarbon group having 6 to 30 carbon atoms for $R^9$ in the general formula (b1-3) include an arylene group such as a phenylene group, a tolylene group, a naphthylene group, a phenanthrylene group, and an anthrylene group; and the like.

Examples of the bivalent group by arbitrarily combining an oxygen atom, an ester group, a carbonyl group, a chain-like hydrocarbon group having 1 to 30 carbon atoms, an alicyclic hydrocarbon group having 3 to 30 carbon atoms, an aromatic hydrocarbon group having 6 to 30 carbon atoms, a nitrogen atom, or a sulfur atom for $R^9$ in the general formula (b1-3) include a bivalent organic group derived from any of the structures represented by the above-described general formulae (R-1) to (R-4).

Specific examples of the crosslinking agent (B) include benzenedimethanol, benzenetrimethanol, benzenetetramethanol, benzenepentamethanol, benzenehexamethanol, biphenyldimethanol, biphenyltrimethanol, biphenyltetramethanol, biphenylpentamethanol, biphenylhexamethanol, hydroxybiphenyldimethanol, hydroxybiphenyltrimethanol, hydroxybiphenyltetramethanol, hydroxybiphenylpentamethanol, hydroxybiphenylhexamethanol, dihydroxybiphenyldimethanol, dihydroxybiphenyltrimethanol, dihydroxybiphenyltetramethanol, dihydroxybiphenylpentamethanol, dihydroxybiphenylhexamethanol, the following compounds represented by formulae (B1) to (B22), and the like.

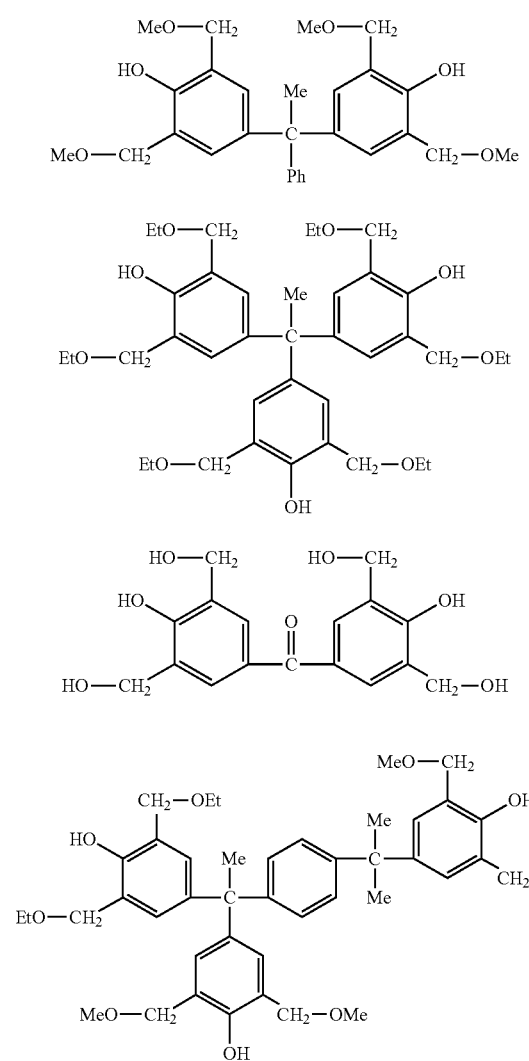

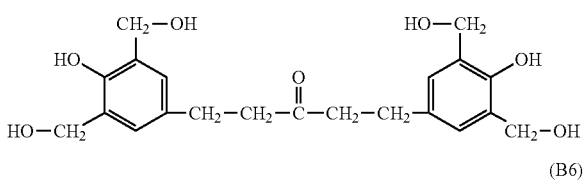

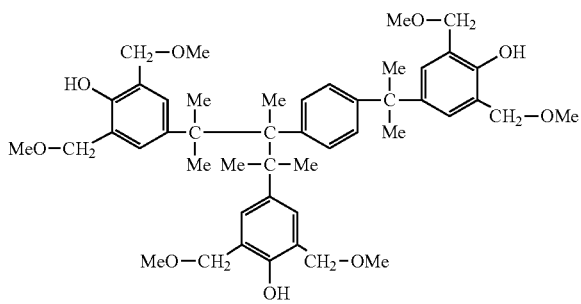

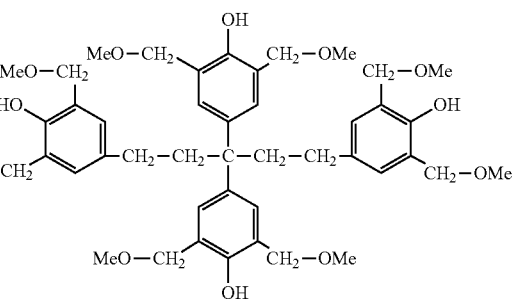

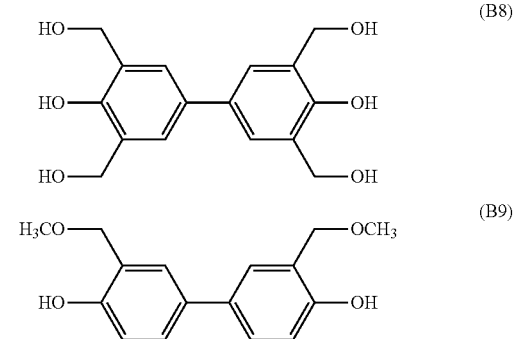

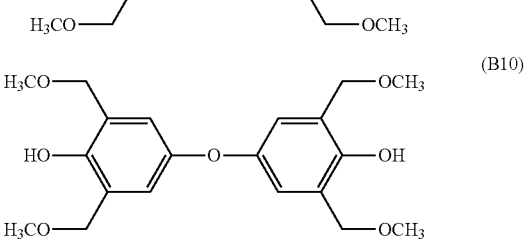

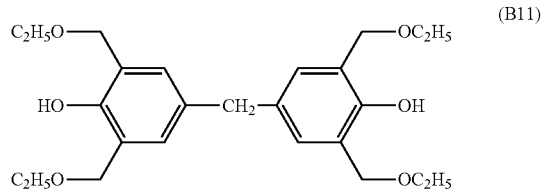

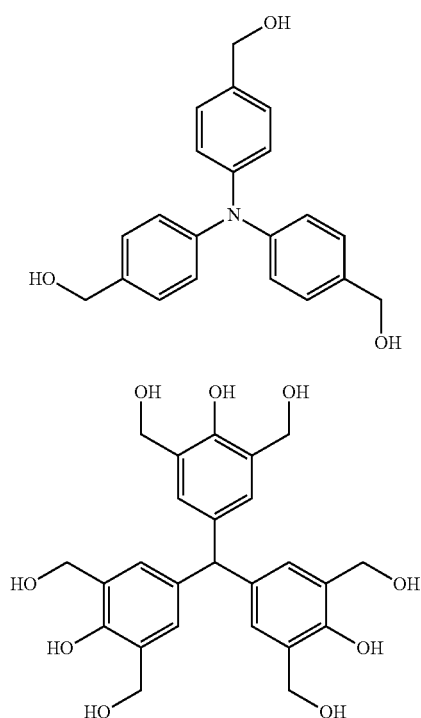
(B12)

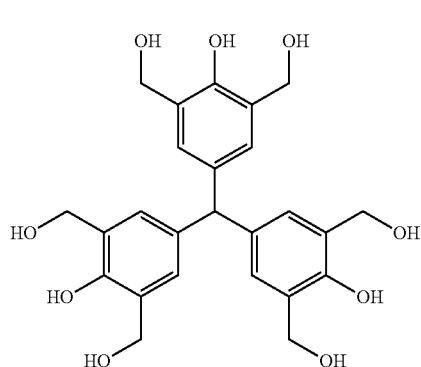
(B13)

(B14)

(B15)

(B16)

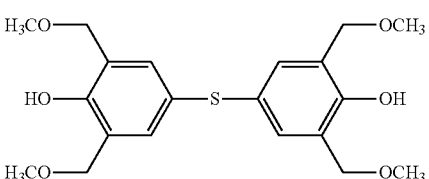
(B17)

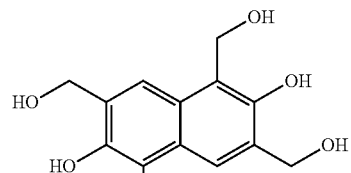
(B18)

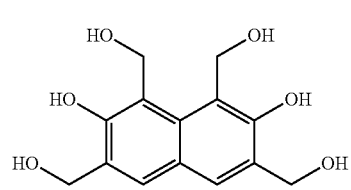
(B19)

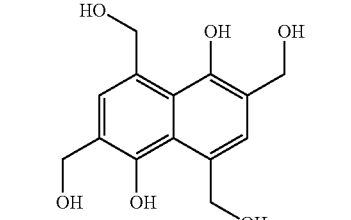
(B20)

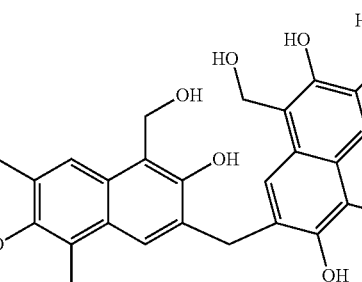
(B21)

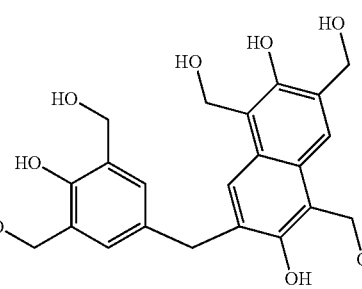
(B22)

The crosslinking agent (B) may be used singly or in combination of two or more types thereof.

The crosslinking agent (B) is used in an amount of normally 500 parts or less by mass, and preferably 100 parts or less by mass based on 100 parts by mass of the base component (A) according to the resist underlayer film-forming composition.

Other Crosslinking Agent

The resist underlayer film-forming composition of the embodiment of the present invention may contain other crosslinking agents other than the crosslinking agent (B).

Examples of the other crosslinking agents include a polynuclear phenol, commercially available curing agents, and the like. Specific examples of the other crosslinking agents include the compounds disclosed in paragraphs [0085] and [0086] of Japanese Patent Application Publication (KOKAI) No. 2004-168748, and the like.

The other crosslinking agents may be used singly or in combination of two or more types thereof. The polynuclear phenol and curing agent may be used in combination.

The other crosslinking agent is used in an amount of normally 500 parts or less by mass, and preferably 100 parts or less by mass based on 100 parts by mass of the base component (A) according to the resist underlayer film-forming composition.

(C) Solvent

The resist underlayer film-forming composition of the embodiment of the present invention is one containing the base component (A) and crosslinking agent (B). And the composition is normally a liquid composition containing a solvent that dissolves the base component (A) (hereinafter may be referred to as "solvent (C)").

The solvent (C) is not particularly limited as long as the solvent (C) dissolves the base component (A). Examples of the solvent (C) include the compounds disclosed in paragraphs [0070] to [0073] of Japanese Patent Application Publication (KOKAI) No. 2004-168748, and the like.

Propylene glycol monomethyl ether, ethylene glycol monoethyl ether acetate, ethyl lactate, n-butyl acetate, ethyl 3-ethoxypropionate, methyl 3-methoxypropionate, ketones such as 2-heptanone and cyclohexanone, γ-butyrolactone, and the like are preferable as the solvent (C).

The solvent (C) may be used singly or in combination of two or more types thereof.

The solvent (C) is used in such an amount that the resulting composition has a solid content of normally 1% to 80% by mass, preferably 3% to 40% by mass, and more preferably 5% to 30% by mass.

The resist underlayer film-forming composition of the embodiment of the present invention may optionally include (D) an acid generator, (E) a promoter, and (F) an additive as long as the desired effects of the invention are not impaired. The resist underlayer film-forming composition preferably includes (E) a promoter.

(D) Acid Generator

The acid generator (D) is a component which generates an acid upon exposure or heating. When the resist underlayer film-forming composition of the embodiment of the present invention contains the acid generator (D), the acid generator (D) ensures that the molecular chains of the resin are effectively crosslinked at a relatively low temperature including room temperature.

Examples of the acid generator capable of generating an acid upon exposure (hereinafter referred to as "photoacid generator") include compounds disclosed in paragraphs [0077] to [0081] of Japanese Patent Application Publication (KOKAI) No. 2004-168748, and the like.

Among the compounds exemplified, diphenyliodonium trifluoromethanesulfonate, diphenyliodonium nonafluoro-n-butanesulfonate, diphenyliodonium pyrenesulfonate, diphenyliodonium n-dodecylbenzenesulfonate, diphenyliodonium 10-camphorsulfonate, diphenyliodonium naphthalenesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium n-dodecylbenzenesulfonate, bis(4-t-butylphenyl)iodonium 10-camphorsulfonate, bis(4-t-butylphenyl)iodonium naphthalenesulfonate, and the like are preferable.

The photoacid generator may be used singly or in combination of two or more types thereof.

Examples of the acid generator capable of generating an acid upon heating (hereinafter referred to as "thermal acid generator") include 2,4,4,6-tetrabromocyclohexadienone, benzoin tosylate, 2-nitrobenzyl tosylate, alkyl sulfonates, and the like.

The thermal acid generator may be used singly or in combination of two or more types thereof. The photoacid generator and thermal acid generator may be used in combination.

The acid generator (D) is used in an amount of normally 5,000 parts or less by mass, preferably 0.1 to 1,000 parts by mass, and more preferably 0.1 to 100 parts by mass based on 100 parts by mass of the base component (A) in the resist underlayer film-forming composition.

(E) Promoter

The promoter (E) is a one-electron oxidizing agent that leads to a sufficient dehydrogenation reaction necessary for oxidative crosslinking, and the like. The term "one-electron oxidizing agent" used herein refers to an oxidizing agent that undergoes one-electron transfer. When cerium(IV) ammonium nitrate is used, the cerium(IV) ion is converted into a cerium(III) ion upon acquisition of one electron. A radical oxidizing agent (e.g., halogen) is converted into an anion upon acquisition of one electron. A phenomenon in which the oxidation target substance (e.g., substrate or catalyst) is oxidized by removing one electron from the oxidation target substance is referred to as "one-electron oxidation", and a component that receives one electron is referred to as "one-electron oxidizing agent".

Typical examples of the one-electron oxidizing agent include (a) a metal compound, (b) a peroxide, (c) a diazo compound, (d) a halogen or a halogen acid, and the like.

Examples of the metal compound (a) include metal compounds that include cerium, lead, silver, manganese, osmium, ruthenium, vanadium, thallium, copper, iron, bismuth, or nickel. Specific examples of the metal compound (a) include (a1) a cerium salt (tetravalent cerium salts) such as cerium (IV) ammonium nitrate (CAN; cerium (IV) ammonium hexanitrate), cerium (IV) acetate, cerium (IV) nitrate, and cerium (IV) sulfate, (a2) a lead compound (tetravalent lead compounds) such as lead tetraacetate and lead (IV) oxide, (a3) a silver compound such as silver (I) oxide, silver (II) oxide, silver carbonate (Fetizon reagent), and silver nitrate, (a4) a manganese compound such as permanganates, active manganese dioxide, and manganese (III) salts, (a5) an osmium compound such as osmium tetroxide, (a6) a ruthenium compound such as ruthenium tetroxide, (a7) a vanadium compound such as $VOCl_3$, $VOF_3$, $V_2O_5$, $NH_4VO_3$, and $NaVO_3$, (a8) a thallium compound such as thallium (III) acetate, thallium (III) trifluoroacetate, and thallium (III) nitrate, (a9) a copper compound such as copper (II) acetate, copper (II) trifluoromethanesulfonate, copper (II) trifluoroborate, copper (II) chloride, and copper (I) acetate, (a10) an iron compound such as iron (III) chloride and potassium hexacyanoferrate (III), (a11) a bismuth compound such as sodium bismuthate, (a12) a nickel compound such as nickel peroxide, and the like.

Examples of the peroxide (b) include a peroxyacid such as peracetic acid and m-chloroperbenzoic acid, hydrogen peroxide; a hydroxyperoxide such as an alkyl hydroxyperoxide (e.g., t-butyl hydroperoxide); a diacyl peroxide; a peroxyacid ester; a peroxyketal; a peroxydicarbonate; a dialkyl peroxide; a peroxyketone; and the like.

Examples of the diazo compound (c) include 2,2'-azobisisobutyronitrile and the like.

Examples of the halogen or the halogen acid (d) include halogens selected from chlorine, bromine, and iodine; a perhalogen acid; a halogen acid; a halous acid; a hypohalous acid; salts thereof, and the like. Examples of the halogen capable of forming the halogen acid include chlorine, bromine, and iodine. Examples of the salts of the halogen acids include sodium perchlorate, sodium bromate, and the like.

Among these, the peroxide (b) and diazo compound (c) are preferable, and m-chloroperbenzoic acid, t-butyl hydroperoxide, and 2,2'-azobisisobutyronitrile are particularly preferred. When these compounds are used as the one-electron oxidizing agent, a metal residue does not adhere to the substrate, being favorable.

The promoter (E) including the one-electron oxidizing agent may be used singly or in combination of two or more types thereof.

The promoter (E) is used in an amount of normally 1,000 parts or less by mass, preferably in the range from 0.01 to 500 parts by mass, and more preferably from 0.1 to 100 parts by mass based on 100 parts by mass of the base component (A) according to the resist underlayer film-forming composition.

(F) Additives

Examples of the additive (F) include a binder resin, a radiation absorber, a surfactant, and the like.

Specific examples of the additive (F) include compounds disclosed in paragraphs [0088] to [0093] of Japanese Patent Application Publication (KOKAI) No. 2004-168748, and the like.

A thermoplastic resin or a thermosetting resin (excluding the resin (A1)) may be used as the binder resin. The thermoplastic resin is a component which provides the resist underlayer film with flowability, mechanical properties, and the like. On the other hand, the thermosetting resin is a component which becomes insoluble in the solvent upon curing due to heating, and prevents intermixing between the resist underlayer film and a resist film formed on the resist underlayer film. The thermosetting resin may preferably be used as the binder resin. A urea resin, a melamine resin, an aromatic hydrocarbon resin, or the like is preferable as the thermosetting resin.

The binder resin may be used singly or in combination of two or more types thereof The binder resin is used in an amount of normally 20 parts or less by mass, and preferably 10 parts or less by mass based on 100 parts by mass of the base component (A) according to the resist underlayer film-forming composition.

The radiation absorber is used in an amount of normally 100 parts or less by mass, and preferably 50 parts or less by mass based on 100 parts by mass of the base component (A) according to the resist underlayer film-forming composition.

The surfactant is a component which improves the applicability, striation, wettability, developability, and the like.

The surfactant may be used singly or in combination of two or more types thereof.

The surfactant is used in an amount of normally 15 parts or less by mass, and preferably 10 parts or less by mass based on 100 parts by mass of the base component (A) according to the resist underlayer film-forming composition.

The resist underlayer film-forming composition of the embodiment of the present invention may further include a preservative, an anti-foaming agent, an adhesion improver, and the like.

According to the resist underlayer film-forming composition of the embodiment of the present invention, a resist underlayer film can easily be formed which exhibits excellent etching resistance, and suppresses a situation in which the underlayer film pattern is bent when etching the substrate.

Additionally, the resist underlayer film formed using the resist underlayer film-forming composition exhibits excellent etching resistance, and suppresses a situation in which the underlayer film pattern is bent when etching the substrate even when transferring a fine pattern. Therefore, the resist underlayer film exhibits an excellent pattern transfer capability and excellent etching selectivity during a dry etching process (i.e., the resist underlayer film is rarely over-etched, and the resist pattern can be transferred to the substrate with good reproducibility). Since the underlayer film pattern is not bent when etching the substrate, an increase in yield is expected to be achieved during microfabrication employed in a lithographic process (particularly the production of integrated circuit devices).

2. Pattern Forming Method

The pattern forming method of the embodiment of the present invention includes (1) a resist underlayer film-forming process in which a specific resist underlayer film-forming composition is used to form a resist underlayer film on a substrate (hereinafter may be referred to as "process (1)"), (1') an intermediate layer-forming process in which an intermediate layer is formed on the resist underlayer film (hereinafter may be referred to as "process (1')"), (2) a resist film-forming process in which a resist composition is coated onto the resist underlayer film on which the intermediate layer is formed to form a resist film (hereinafter may be referred to as "process (2)"), (3) an exposure process in which the resist film is subjected to exposing by selectively applying radiation (hereinafter may be referred to as "process (3)"), (4) a resist pattern-forming process in which the exposed resist film is subjected to developing to form a resist pattern (hereinafter may be referred to as "process (4)"), and (5) a pattern-forming process in which the intermediate layer, the resist underlayer film, and the substrate are dry-etched using the resist pattern as a mask to form a given pattern on the substrate (hereinafter may be referred to as "process (5)").

In the process (1), the resist underlayer film is formed on the substrate.

Specifically, the resist underlayer film can be formed by a step for applying the resist underlayer film-forming composition to the substrate to form a coating film, and a step for heating the film together with the substrate to form a resist underlayer film on the substrate. The description given above in connection with the resist underlayer film-forming composition of the embodiment of the present invention may be applied to the resist underlayer film-forming composition used in the process (1).

A silicon wafer, an aluminum-coated wafer, or the like can be used as the substrate.

The coating method of the resist underlayer film-forming composition is not particularly limited and the composition may be applied to the substrate by an appropriate method (e.g., spin coating, cast coating, or roll coating).

The coating film is normally heated in air.

The heating temperature is normally in the range from 300° C. to 500° C., and preferably from 350° C. to 450° C. If the heating temperature is lower than 300° C., oxidative crosslinking may not sufficiently proceed, so that the underlayer film may not exhibit the desired properties.

The heating time is in the range from 30 to 1,200 seconds, and preferably from 60 to 600 seconds.

The oxygen concentration when curing the coating film is preferably 5% or more by volume. If the oxygen concentration when curing the coating film is low, oxidative crosslinking may not sufficiently proceed, so that the underlayer film may not exhibit the desired properties.

The film may be preheated at a temperature between 60° C. and 250° C. before heating the coating film at a temperature ranging from 300° C. to 500° C.

The preheating time is not particularly limited and is preferably in the range from 10 to 300 seconds and more preferably from 30 to 180 seconds.

When the preheating is conducted, the solvent can be volatilized (i.e., the film can be made dense), and the dehydrogenation reaction can proceed efficiently.

In the process (1), when the coating film is heated, the film is normally cured to obtain a resist underlayer film. On the other hand, when a specific photocuring agent (crosslinking agent) is added to the resist underlayer film-forming composition and the process includes an exposing step, the resist underlayer film may be formed by applying radiation to the heated film. The radiation used to cure the coating film is appropriately selected from visible rays, ultraviolet rays, deep ultraviolet rays, X-rays, electron beams, γ-rays, molecular beams, ion beams, and the like depending on the type of acid generator included in the resist underlayer film-forming composition.

The thickness of the resist underlayer film formed by the process (1) is normally in the range from 0.1 to 5 μm.

The hydrogen content in the resist underlayer film is in the range from 0 to 50 atom %, and preferably from 0 to 35 atom %. The hydrogen content in the resist underlayer film is measured by the method described in Examples.

In the process (1'), the intermediate layer (intermediate film) is formed on the resist underlayer film.

The intermediate layer enhances the functions of the resist underlayer film and/or the resist film, or provides the resist underlayer film and/or the resist film with an additional function when forming a resist pattern. The antireflective function of the resist underlayer film can be enhanced by forming an antireflective film as the intermediate layer.

The intermediate layer can be formed using an organic compound or an inorganic oxide. Examples of the organic compound include "DUV-42", "DUV-44", "ARC-28", and "ARC-29" manufactured by Brewer Science; "AR-3", and "AR-19" manufactured by Rohm and Haas; and the like. Examples of the inorganic oxide include "NFC SOG01", "NFC SOG04", and "NFC SOG080" manufactured by JSR Corporation; a polysiloxane, titanium oxide, alumina, and tungsten oxide, formed by CVD; and the like.

The forming method of the intermediate layer is not particularly limited and the intermediate layer can be formed by an arbitrary method such as a coating method and CVD. It is preferable to form the intermediate layer by a coating method. When using a coating method, the intermediate layer can be formed continuously with the resist underlayer film.

The thickness of the intermediate layer is not particularly limited and may be appropriately selected depending on the desired functions. It is preferably in the range from 10 to 3,000 nm and more preferably from 20 to 300 nm.

In the process (2), the resist film is formed on the resist underlayer film (on which the intermediate layer is formed) using the resist composition. Specifically, when the resist composition is coated on the resist underlayer film so that the resulting resist film has a given thickness, and the film is subjected to prebaking, a solvent in the coating is volatilized to form the resist film.

Examples of the resist composition include a positive-tone or negative-tone chemically-amplified resist composition containing a photoacid generator; a positive-tone resist composition containing an alkali-soluble resin and a quinondiazide photosensitizer; a negative-tone resist composition containing an alkali-soluble resin and a crosslinking agent; and the like.

The resist composition used when the resist film is formed on the resist underlayer film on which the intermediate layer is formed normally has a solid content of about 5% to 50% by mass, and is used after filtering the resist composition through a filter having a pore size of about 0.2 μm. A commercially available resist composition may be used in the process (2).

The coating method of the resist composition is not particularly limited and the composition may be applied by spin coating or the like.

The prebaking temperature may be appropriately selected depending on the type of the resist composition and the like, but is normally in the range from about 30° C. to 200° C., and preferably from 50° C. to 150° C.

In the process (3), the resist film is selectively exposed by applying radiation to a given area of the resist film.

The radiation for exposure is appropriately selected from visible rays, ultraviolet rays, far-ultraviolet rays, X-rays, electron beams, γ-rays, molecular beams, ion beams, and the like depending on the type of a photoacid generator contained in the resist composition. Among these, far-ultraviolet rays are preferable, and KrF excimer laser beams having a wavelength of 248 nm, ArF excimer laser beams having a wavelength of 193 nm, $F_2$ excimer laser beams having a wavelength of 157 nm, $Kr_2$ excimer laser beams having a wavelength of 147 nm, ArKr excimer laser beams having a wavelength of 134 nm, and extreme-ultraviolet rays having a wavelength of 13 nm are particularly preferred.

The resist pattern-forming method of the embodiment of the present invention may not include a developing process (e.g., nanoimprint method).

In the process (4), the exposed resist film is developed using a developer to form a resist pattern.

The developer used in the process (4) is appropriately selected according to the type of the resist composition. Specific example thereof is an alkaline aqueous solution containing sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5.4.0]-7-undecene, or 1,5-diazabicyclo-[4.3.0]-5-nonene.

The alkaline aqueous solution may contain an aqueous organic solvent such as an alcohol including methanol and ethanol; a surfactant in an appropriate amount.

When the resist film after developing is subjected to rinsing and drying, a given resist pattern can be formed.

In this process, the exposed resist film may be subjected to post-exposure bake (PEB) in order to improve the resolution, pattern profile, developability, and the like. The PEB temperature may be appropriately selected depending on the type of the resist composition and the like. It is normally in the range from about 50° C. to 200° C., and preferably from 70° C. to 150° C.

In the process (5), the intermediate layer and the resist underlayer film are dry-etched utilizing a gas plasma (e.g., oxygen plasma) using the resist pattern as a mask to form a given pattern for processing the substrate.

The pattern-forming method that utilizes the resist underlayer film-forming composition according to one embodiment of the embodiment of the invention may be a pattern-forming method that utilizes a nanoimprint method or the like.

EXAMPLES

Hereinafter, the embodiments of the present invention are described in detail using Examples. The present invention is in no way limited by these Examples. In addition, "part" and "%" in the description are based on weight unless otherwise indicated.

1. Synthesis of Base Component (Resin Having Aromatic Ring)

Synthesis Example 1

A separable flask equipped with a thermometer was charged with 100 parts of acenaphthylene, 78 parts of toluene, 52 parts of dioxane, and 3 parts of azobisisobutyronitrile in a nitrogen atmosphere. The mixture was stirred at a temperature of 70° C. for 5 hours to obtain a resin having a molecular weight of 10,000. After the addition of 5.2 parts of p-toluenesulfonic acid monohydrate and 40 parts of paraformaldehyde, the mixture was heated to 120° C., and stirred for 6 hours. The reaction solution was poured into a large quantity of isopropanol, and a precipitated resin was filtered to obtain a resin (A-1).

The weight average molecular weight (Mw) of the resin (A-1) was 20,000.

The weight average molecular weight (Mw) in Example was measured by gel permeation chromatography (detector: differential refractometer) using GPC columns manufactured by Tosoh Corporation (G2000HXL×2, G3000HXL×1) at a flow rate of 1.0 ml/min and a column temperature of 40° C. (eluant: tetrahydrofuran, standard: monodisperse polystyrene).

Synthesis Example 2

A reactor equipped with a condenser, a thermometer, and a stirrer was charged with 100 parts of phenol, 100 parts of propylene glycol monomethyl ether acetate, and 50 parts of paraformaldehyde. After the addition of 2 parts of oxalic acid, the mixture was heated to 120° C. while dehydrating the mixture, and reacted for 5 hours to obtain a resin (A-2) having the following structural unit.

The weight average molecular weight (Mw) of the resin (A-2) was 7,000.

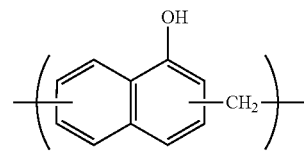

(A-2)

Synthesis Example 3

A reactor equipped with a condenser, a thermometer, and a stirrer was charged with 100 parts of α-naphthol, 100 parts of propylene glycol monomethyl ether acetate, and 50 parts of paraformaldehyde. After the addition of 2 parts of oxalic acid, the mixture was heated to 120° C. while dehydrating the mixture, and reacted for 5 hours to obtain a resin (A-3) having the following structural unit.

The weight average molecular weight (Mw) of the resin (A-3) was 3,000.

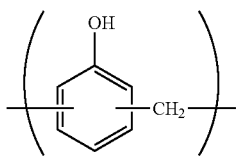

(A-3)

Synthesis Example 4

A separable flask equipped with a thermometer was charged with 100 parts of styrene, 78 parts of toluene, and 3 parts of azobisisobutyronitrile in a nitrogen atmosphere. The mixture was stirred at a temperature of 70° C. for 5 hours. The reaction solution was poured into a large quantity of isopropanol, and a precipitated resin was filtered to obtain a resin (A-4) having the following structural unit.

The weight average molecular weight (Mw) of the resin (A-4) was 10,000.

(A-4)

2. Preparation of Resist Underlayer Film-forming Composition 2-1. Examples 1 to 14

Example 1

10 parts of the resin (A-1) was dissolved in 1 part of dihydroxybiphenyltetramethanol (compound (B-1) represented below) as a crosslinking agent, 0.1 part of diphenyliodonium trifluoromethanesulfonate (C-1) as a thermal acid generator and 90 parts of propylene glycol monomethyl acetate (D-1) as a solvent (see Table 1). The solution was filtered through a membrane filter having a pore size of 0.1 μm to prepare a resist underlayer film-forming composition for Example 1.

Examples 2 to 14

Resist underlayer film-forming compositions for Examples 2 to 14 were prepared in the same manner as that in Example 1, except that the type and the amount of each component were changed as shown in Table 1.

Note that the resins (A-2) to (A-4) used in Examples 2 to 4 (see Table 1) were obtained in Synthesis Examples 2 to 4, respectively. The crosslinking agents (B-1) to (B-10) in Table 1 are shown below.

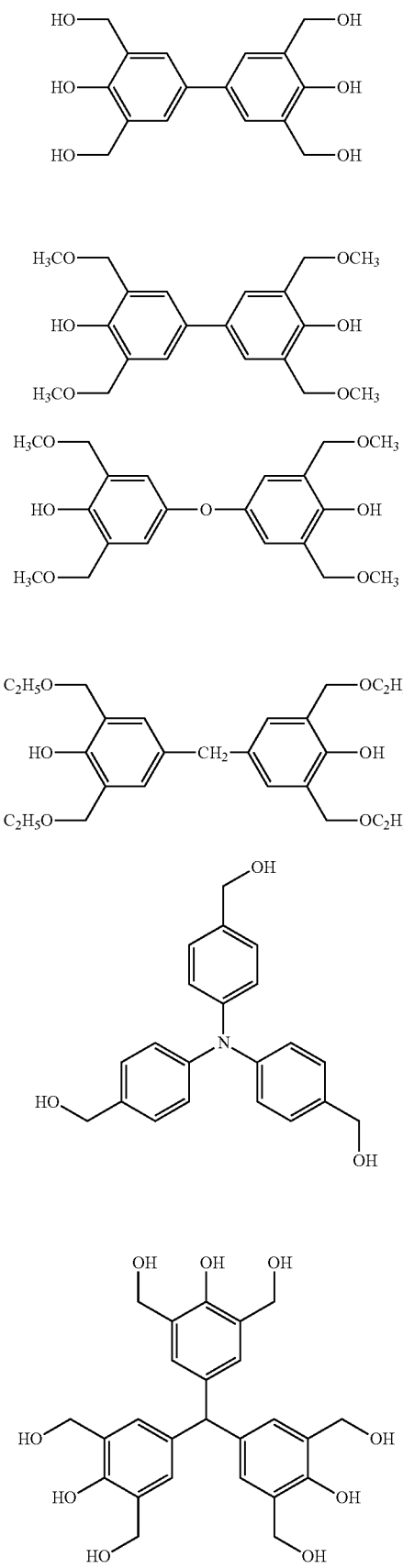
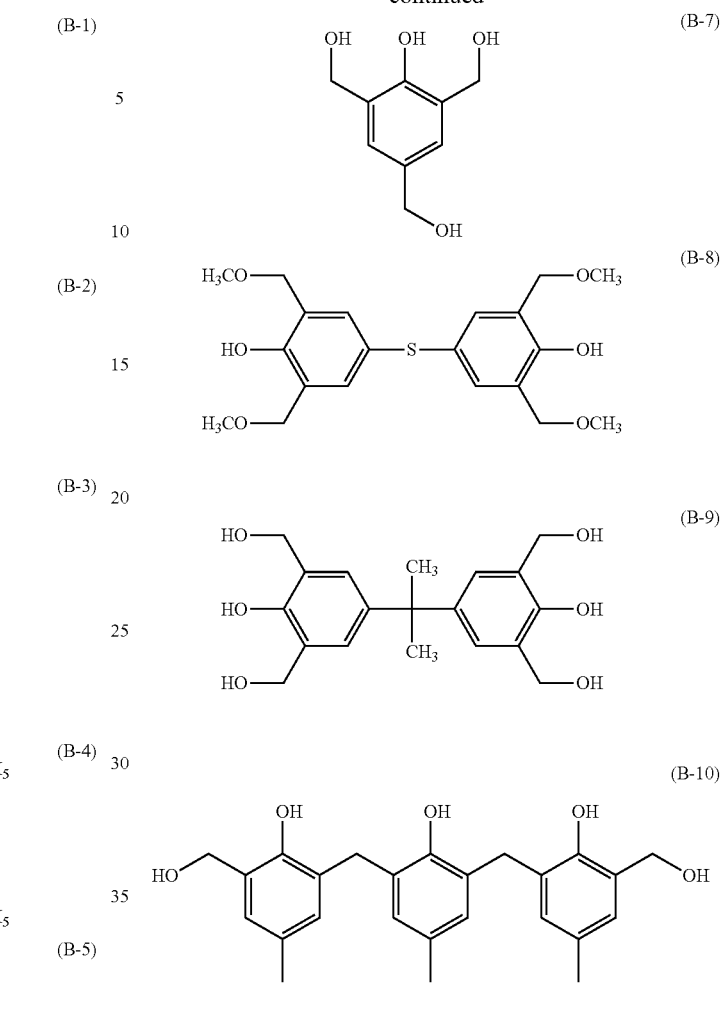

2-2. Comparative Examples 1 to 3

Comparative Example 1

10 parts of the resin (A-1) was dissolved in 1 part of 1,3,4,6-tetrakis(methoxymethyl)glycoluril (compound (b-1) represented below) as a crosslinking agent, 0.1 part of diphenyliodonium trifluoromethanesulfonate (C-1) as a thermal acid generator and 90 parts of propylene glycol monomethyl acetate (D-1) as a solvent (see Table 1). The solution was filtered through a membrane filter having a pore size of 0.1 μm to prepare a resist underlayer film-forming composition for Comparative Example 1.

Comparative Examples 2 and 3

Resist underlayer film-forming compositions for Comparative Examples 2 and 3 were prepared in the same manner as that in Comparative Example 1, except that the type and the amount of each component were changed as shown in Table 1.

The crosslinking agents (b-1) to (b-3) in Table 1 are shown below.

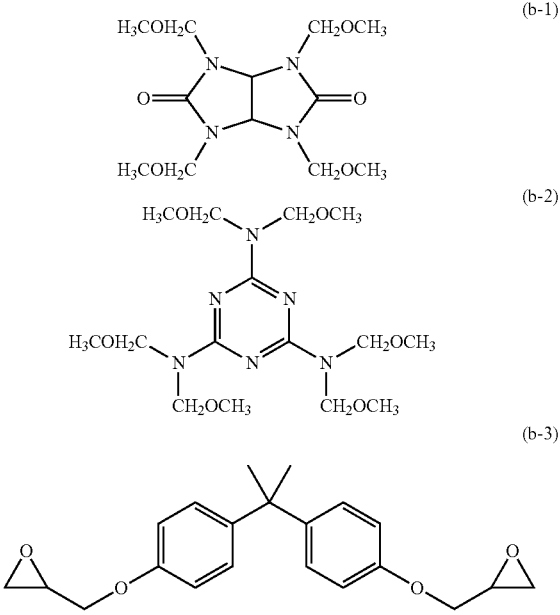

TABLE 1

| | Base component (A) (type/parts) | Crosslinking agent (B) (type/parts) | Thermal acid generator (C) (type/parts) | Solvent (D) (type/parts) |
|---|---|---|---|---|
| Example 1 | A-1/10 | B-1/1 | C-1/0.1 | D-1/90 |
| Example 2 | A-2/10 | B-1/1 | C-1/0.1 | D-1/90 |
| Example 3 | A-3/10 | B-1/1 | C-1/0.1 | D-1/90 |
| Example 4 | A-4/10 | B-1/1 | C-1/0.1 | D-1/90 |
| Example 5 | A-1/10 | B-2/1 | C-1/0.1 | D-1/90 |
| Example 6 | A-1/10 | B-2/1 | — | D-1/90 |
| Example 7 | A-1/10 | B-3/1 | C-1/0.1 | D-1/90 |
| Example 8 | A-1/10 | B-4/1 | C-1/0.1 | D-1/90 |
| Example 9 | A-1/10 | B-5/1 | C-1/0.1 | D-1/90 |
| Example 10 | A-1/10 | B-6/1 | C-1/0.1 | D-1/90 |
| Example 11 | A-1/10 | B-7/1 | C-1/0.1 | D-1/90 |
| Example 12 | A-1/10 | B-8/1 | C-1/0.1 | D-1/90 |
| Example 13 | A-1/10 | B-9/1 | C-1/0.1 | D-1/90 |
| Example 14 | A-1/10 | B-10/1 | C-1/0.1 | D-1/90 |
| Comparative Example 1 | A-1/10 | b-1/1 | C-1/0.1 | D-1/90 |
| Comparative Example 2 | A-1/10 | b-2/1 | C-1/0.1 | D-1/90 |
| Comparative Example 3 | A-1/10 | b-3/1 | C-1/0.1 | D-1/90 |

3. Evaluation of Resist Underlayer Film-forming Composition

The resist underlayer film-forming compositions obtained in Examples 1 to 14 and Comparative Examples 1 to 3 were evaluated as described below. The results are shown in Table 2.

(1) Pattern Shape after Processing Substrate

Each resist underlayer film-forming composition obtained in Examples and Comparative Examples was spin-coated onto an 8-inch silicon wafer, heated at a temperature of 180° C. for 60 seconds using a hot plate (oxygen concentration: 20 vol %), and then heated at 350° C. for 120 seconds to form a resist underlayer film having a thickness of 0.3 μm.

After that, a three-layer resist process spin-on-glass composition solution (manufactured by JSR Corporation) was spin-coated onto the resist underlayer film, heated at a temperature of 200° C. for 60 seconds, and then heated at 300° C. for 60 seconds using a hot plate to form an intermediate film having a thickness of 0.05 μm. Subsequently, an ArF resist composition solution (acrylic ArF photoresist manufactured by JSR Corporation) was spin-coated onto the intermediate film, and prebaked at a temperature of 130° C. for 90 seconds using a hot plate to form a resist film having a thickness of 0.2 μm. The resist film was then exposed via a mask pattern for an optimum exposure time using an ArF excimer laser exposure system manufactured by Nikon Corporation (numerical aperture: 0.78, exposure wavelength: 193 nm). After postbaking the resist film at a temperature of 130° C. for 90 seconds using a hot plate, the resist film was developed at a temperature of 25° C. for 1 minute using a 2.38% tetramethylammonium hydroxide aqueous solution, rinsed with water, and dried to obtain an ArF positive-tone resist pattern. The intermediate film was processed using the resist pattern as a mask, and the resist underlayer film was processed using the intermediate film as a mask. The substrate was processed using the resist underlayer film as a mask.

The shape of the resulting pattern was observed using a scanning electron microscope, and evaluated in accordance with the following criteria.

"Acceptable": The pattern of the resist underlayer film stood upright.

"Unacceptable": The pattern of the resist underlayer film collapsed or bent.

(2) Etching Resistance

Each resist underlayer film-forming composition obtained in Examples and Comparative Examples was spin-coated onto an 8-inch silicon wafer, heated at a temperature of 180° C. for 60 seconds using a hot plate (oxygen concentration: 20 vol %), and then heated at 350° C. for 120 seconds to form a resist underlayer film having a thickness of 0.3 μm. The resist underlayer film was etched using an etching system "EXAM" manufactured by Shinko Seiki Co., Ltd. The conditions were $CF_4/Ar/O_2$ ($CF_4$: 40 ml/min, Ar: 20 ml/min, $O_2$: 5 ml/min), pressure: 20 Pa, RF power: 200 W, etching time: 40 sec, and temperature: 15° C.

The etching rate was calculated based on the thickness of the resist underlayer film measured before and after etching, and the etching resistance was evaluated in accordance with the following criteria.

"Acceptable": The etching rate was 150 nm/min or less.

"Fair": The etching rate was more than 150 and less than 200 nm/min.

"Unacceptable": The etching rate was 200 nm/min or more.

(3) Elemental Composition

Each resist underlayer film-forming composition obtained in Examples and Comparative Examples was spin-coated onto an 8-inch silicon wafer, heated at a temperature of 180° C. for 60 seconds using a hot plate (oxygen concentration: 20 vol %), and then heated at 350° C. for 120 seconds to form a resist underlayer film having a thickness of 0.3 μm. The weight percent of each element contained in the resist underlayer film was calculated using a carbon-hydrogen-nitrogen analyzer "JM10" manufactured by J-Science Lab Co., Ltd.

The number of respective atoms contained in the resist underlayer film was calculated by "weight percent (wt %) of elements/mass (g) of elements", and the hydrogen content (atom %) after dehydrogenation was calculated by "number of hydrogen atoms contained in resist underlayer film/total number of atoms contained in resist underlayer film".

The hydrogen content before dehydrogenation was measured using a resist underlayer film formed by spin-coating the resist underlayer film-forming composition onto an 8-inch silicon wafer, and heating the applied composition at a temperature of 200° C. for 60 seconds using a hot plate (oxygen concentration: 20 vol %).

TABLE 2

| | Pattern shape | Etching resistance | Hydrogen content (atom %) | |
|---|---|---|---|---|
| | | | Before dehydrogenation | After dehydrogenation |
| Example 1 | Acceptable | Acceptable | 50 | 35 |
| Example 2 | Acceptable | Fair | 50 | 30 |
| Example 3 | Acceptable | Acceptable | 40 | 25 |
| Example 4 | Acceptable | Fair | 40 | 25 |
| Example 5 | Acceptable | Acceptable | 50 | 35 |
| Example 6 | Acceptable | Fair | 50 | 30 |
| Example 7 | Acceptable | Acceptable | 40 | 25 |
| Example 8 | Acceptable | Acceptable | 40 | 25 |
| Example 9 | Acceptable | Fair | 40 | 25 |
| Example 10 | Acceptable | Acceptable | 50 | 35 |
| Example 11 | Acceptable | Acceptable | 50 | 30 |
| Example 12 | Acceptable | Fair | 40 | 25 |
| Example 13 | Acceptable | Acceptable | 50 | 35 |
| Example 14 | Acceptable | Acceptable | 50 | 30 |
| Comparative Example 1 | Unacceptable | Acceptable | 50 | 47 |
| Comparative Example 2 | Unacceptable | Fair | 50 | 48 |
| Comparative Example 3 | Unacceptable | Fair | 50 | 47 |

As is clear from Table 2, resist underlayer films excellent in pattern transfer capability and etching resistance could be formed using the resist underlayer film-forming compositions obtained in Examples 1 to 14.

According to the resist underlayer film-forming composition of the embodiment of the present invention, a resist underlayer film can be formed which leads to excellent etching resistance, and suppresses a situation in which the underlayer film pattern is bent when transferring a fine pattern by etching. Therefore, the resist underlayer film-forming composition is more suitably used for microfabrication employed in a lithographic process. Particularly the resulting resist underlayer film exhibits an excellent pattern transfer capability and excellent etching selectivity during a dry etching process, in other words, the resist underlayer film is rarely over-etched, and the resist pattern can be transferred to the substrate with good reproducibility. In addition, since the underlayer film pattern is not bent when etching the substrate, an increase in yield is expected to be achieved in microfabrication employed in a lithographic process, and particularly the production of integrated circuit devices.

The pattern-forming method of the embodiment of the present invention utilizing such a resist underlayer film-forming composition may be useful for a lithographic process, and particularly an integrated circuit device production process. More specifically, the embodiment of the present invention relates to a pattern-forming method that utilizes oxidative crosslinking due to dehydrogenation when forming a resist underlayer film, and may suitably be used for microfabrication employed in a lithographic process that utilizes various types of radiation (particularly production of integrated circuit devices), and a resist underlayer film-forming composition used for the pattern-forming method.

Obviously, numerous modifications and variations of the present invention are possible in light of the above teachings. It is therefore to be understood that within the scope of the appended claims, the invention may be practiced otherwise than as specifically described herein.

The invention claimed is:
1. A pattern-forming method comprising:
    applying a resist underlayer film-forming composition on a substrate;
    heating the resist underlayer film-forming composition at a temperature of no less than 200° C. to form a resist underlayer film;
    forming an intermediate layer on the resist underlayer film;
    applying a resist composition to the resist underlayer film on which the intermediate layer is formed to form a resist film;
    exposing the resist film by selectively applying radiation to the resist film;
    developing the exposed resist film to form a resist pattern; and
    dry-etching the intermediate layer, the resist underlayer film, and the substrate using the resist pattern as a mask to form a given pattern on the substrate,
    the resist underlayer film-forming composition comprising: a base component which is a novolac resin, a resol resin, a styrene resin, an acenaphthylene resin, or a resin having a fullerene skeleton; and a crosslinking agent having a partial structure represented by formula (i),

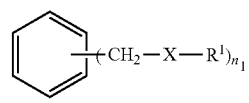

(i)

wherein
    X represents an oxygen atom, a sulfur atom, or —NR—, wherein R represents a hydrogen atom, an alkyl group having 1 to 9 carbon atoms, or an aryl group having 6 to 30 carbon atoms, and in a case where a plurality of X are present, each of the plurality of X is either identical or different,
    $n_1$ is an integer from 1 to 6, and
    $R^1$ represents a hydrogen atom, an alkyl group having 1 to 9 carbon atoms, or an aryl group having 6 to 30 carbon atoms, wherein in a case where a plurality of $R^1$ are present, each of the plurality of $R^1$ is either identical or different,
    wherein the resist underlayer film comprises hydrogen atoms, and a content of the hydrogen atoms in the resist underlayer film is decreased to no greater than 35 atom % by the heating to form the resist underlayer film.
2. The pattern-forming method according to claim 1, wherein the crosslinking agent is a compound represented by formula (b1-1), a compound represented by formula (b2), or both thereof,

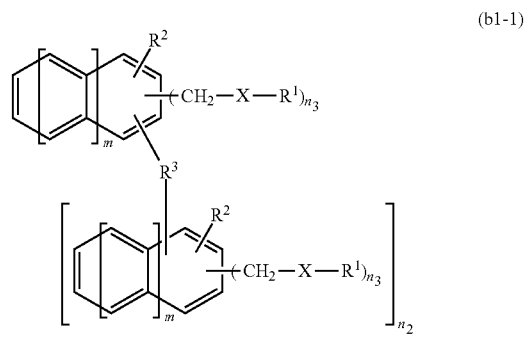

(b1-1)

wherein
X represents an oxygen atom, a sulfur atom, or —NR—, wherein R represents a hydrogen atom, an alkyl group having 1 to 9 carbon atoms, or an aryl group having 6 to 30 carbon atoms, and in a case where a plurality of X are present, each of the plurality of X is identical or different, $n_2$ is an integer from 1 to 5,
$n_3$ is independently an integer from 1 to 4,
m is independently 0 or 1,
$R^1$ represents a hydrogen atom, an alkyl group having 1 to 9 carbon atoms, or an aryl group having 6 to 30 carbon atoms, wherein in a case where a plurality of $R^1$ are present, each of the plurality of $R^1$ is identical or different,
$R^2$ represents a hydrogen atom, a hydroxyl group, an alkyl group having 1 to 9 carbon atoms, or an aryl group having 6 to 22 carbon atoms, wherein in a case where a plurality of $R^2$ is present, each of the plurality of $R^2$ is either identical or different, and
$R^3$ represents a single bond, an oxygen atom, an ester group, a carbonyl group, a chain hydrocarbon group having 1 to 30 carbon atoms, an alicyclic hydrocarbon group having 3 to 30 carbon atoms, an aromatic hydrocarbon group having 6 to 30 carbon atoms, a nitrogen atom, a sulfur atom, or an $(n_2+1)$-valent group which is an arbitrary combination thereof,

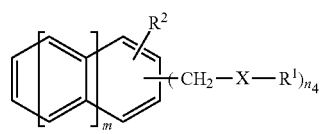

(b2)

wherein
X represents an oxygen atom, a sulfur atom, or —NR—, wherein R represents a hydrogen atom, an alkyl group having 1 to 9 carbon atoms, or an aryl group having 6 to 30 carbon atoms, and in a case where a plurality of X are present, each of the plurality of X is either identical or different, $n_4$ is an integer from 1 to 5,
m is 0 or 1,
$R^1$ represents a hydrogen atom, an alkyl group having 1 to 9 carbon atoms, or an aryl group having 6 to 30 carbon atoms, wherein in a case where a plurality of $R^1$ are present, each of the plurality of $R^1$ is either identical or different, and
$R^2$ represents a hydrogen atom, a hydroxyl group, an alkyl group having 1 to 9 carbon atoms, or an aryl group having 6 to 22 carbon atoms.

3. The pattern-forming method according to claim 1, wherein the crosslinking agent is a compound represented by formula (b1-2),

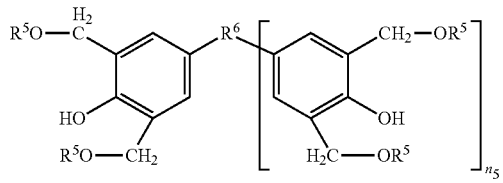

(b1-2)

wherein
$n_5$ is an integer from 1 to 5,
$R^5$ represents independently a hydrogen atom, an alkyl group having 1 to 9 carbon atoms, or an aryl group having 6 to 30 carbon atoms, and
$R^6$ represents a single bond, an oxygen atom, an ester group, a carbonyl group, a chain hydrocarbon group having 1 to 30 carbon atoms, an alicyclic hydrocarbon group having 3 to 30 carbon atoms, an aromatic hydrocarbon group having 6 to 30 carbon atoms, a nitrogen atom, a sulfur atom, or an $(n_5+1)$-valent group which is an arbitrary combination thereof.

4. The pattern-forming method according to claim 1, wherein the crosslinking agent is a compound represented by formula (b1-3),

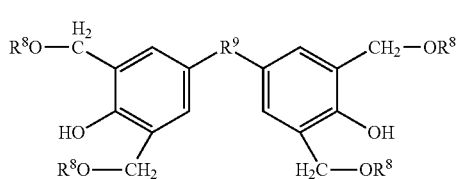

(b1-3)

wherein
$R^8$ represents independently a hydrogen atom, an alkyl group having 1 to 9 carbon atoms, or an aryl group having 6 to 30 carbon atoms, and
$R^9$ represents a single bond, an oxygen atom, an ester group, a carbonyl group, a chain hydrocarbon group having 1 to 30 carbon atoms, an alicyclic hydrocarbon group having 3 to 30 carbon atoms, an aromatic hydrocarbon group having 6 to 30 carbon atoms, a sulfur atom, —NR—, or a divalent group which is an arbitrary combination thereof, wherein R represents a hydrogen atom, an alkyl group having 1 to 9 carbon atoms, or an aryl group having 6 to 30 carbon atoms.

5. The pattern-forming method according to claim 1, wherein the resist underlayer film-forming composition further comprises a solvent.

6. The pattern-forming method according to claim 1, wherein a content of hydrogen atoms in the resist underlayer film is no less than 25 atom % and no greater than 35% after the heating to form the resist underlayer film.

* * * * *